(12) United States Patent
Yamamoto et al.

(10) Patent No.: US 8,043,039 B2
(45) Date of Patent: Oct. 25, 2011

(54) SUBSTRATE TREATMENT APPARATUS

(75) Inventors: Yuichi Yamamoto, Tokyo (JP); Akihiro Teramoto, Koshi (JP); Wataru Tsukinoki, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 508 days.

(21) Appl. No.: 12/207,809

(22) Filed: Sep. 10, 2008

(65) Prior Publication Data

US 2009/0081009 A1 Mar. 26, 2009

(30) Foreign Application Priority Data

Sep. 20, 2007 (JP) .................................. 2007-243470
May 27, 2008 (JP) .................................. 2008-137444

(51) Int. Cl.
*H01L 21/677* (2006.01)
(52) U.S. Cl. ..................... 414/217; 414/222.01; 414/940
(58) Field of Classification Search .................. 414/217, 414/940, 222.01
See application file for complete search history.

(56) References Cited

U.S. PATENT DOCUMENTS

| 5,562,383 | A  | * | 10/1996 | Iwai et al. ................... 414/217.1 |
| 7,578,650 | B2 | * | 8/2009 | Aalund et al. ................ 414/806 |
| 2002/0182040 | A1 | * | 12/2002 | Kimura et al. ............ 414/331.04 |
| 2006/0072986 | A1 | * | 4/2006 | Perlov et al. ................... 414/217 |

FOREIGN PATENT DOCUMENTS

| JP | 10-270530 | 10/1998 |
| JP | 2000-124301 | 4/2000 |
| JP | 2004-189361 | 7/2004 |
| JP | 2006-54438 | 2/2006 |
| JP | 2006-273457 | 10/2006 |

OTHER PUBLICATIONS

Office Action issued Jun. 7, 2011, in Japanese Patent Application No. 2008-137444.

* cited by examiner

*Primary Examiner* — Scott Lowe
(74) *Attorney, Agent, or Firm* — Oblon, Spivak, McClelland, Maier & Neustadt, L.L.P.

(57) ABSTRACT

A substrate treatment apparatus is disclosed. The substrate treatment apparatus includes: a cassette loading portion on which a cassette for containing a substrate is loaded when the cassette is carried to/from outside of the substrate treatment apparatus; a substrate treatment portion for performing a treatment on the substrate; a substrate carrying portion for carrying the substrate in the cassette loaded on the cassette loading portion to the substrate treatment portion, and carrying the substrate that has been subjected to the treatment by the substrate treatment portion to the cassette on the cassette loading portion; a vacant cassette loading portion on which the cassette caused to be vacant by carrying the substrate to the substrate treatment portion is temporarily loaded; and a vacant cassette transfer mechanism for transferring the vacant cassette between the vacant cassette loading portion and the cassette loading portion.

9 Claims, 26 Drawing Sheets

SUBSTRATE TREATMENT APPARATUS

BACKGROUND OF THE INVENTION

1. Field of the Invention

The present invention relates to a substrate treatment apparatus for performing treatment on a substrate.

2. Description of the Related Art

In a photolithography process in a manufacturing process of a semiconductor device, a series of treatments including a resist coating treatment, an exposing treatment, and a developing treatment are performed, for example. In the resist coating treatment, a resist solution is applied to a wafer to form a resist film. In the exposing treatment, the resist film is exposed to have a predetermined circuit pattern. In the developing treatment, the exposed resist film is developed. Thus, a predetermined resist pattern is formed on the wafer. The series of treatments are performed in a coating/developing apparatus to which various kinds of treatment units for performing treatments on a wafer, a carrying apparatus for carrying the wafer, and the like are provided.

Generally, the coating/developing apparatus includes a cassette station, a treatment station, and an interface station. The cassette station is used for carrying a cassette into/from outside. To the treatment station, a plurality of treatment units for performing various kinds of treatments such as the resist coating treatment, the developing treatment, and a heat treatment are provided. Through the interface station, a wafer is delivered/received between an adjacent exposing apparatus and the treatment station.

On the cassette station, a cassette loading table on which a cassette externally carried in is loaded, a wafer carrying apparatus for carrying a wafer between the cassette on the cassette loading table and the treatment station, and the like are provided (see, Japanese Patent Application Laid-open No. 2006-54438).

In performing a treatment on a wafer in the coating/developing apparatus, first, a cassette that contains a plurality of wafers of one lot is loaded on the cassette loading table by an external cassette carrying apparatus. Next, the wafers in the cassette are sequentially carried to the treatment station by the wafer carrying apparatus. In the treatment station, the wafers are sequentially carried to the plurality of treatment units such as the resist coating unit and the heat treatment unit to be subjected to predetermined treatments. After that, the wafers are carried to the exposing apparatus and subjected to exposure. Then, the wafers are returned to the treatment station and sequentially carried to the developing treatment unit, the heat treatment unit, and the like to be subjected to predetermined treatments. The wafers that have been subjected to the series of treatments in the treatment station are sequentially returned to the original cassette on the cassette loading table by the wafer carrying apparatus. When all the wafers of one lot are returned to the cassette on the cassette loading table, the cassette is carried out of the coating/developing apparatus by the external cassette carrying apparatus.

Incidentally, these days, the coating/developing apparatus is being required to deal with a so-called small-lot treatment in response to a change to a low-volume production of diversified products. In the case of the small-lot treatment, the number of wafers contained in one cassette is reduced. For this reason, when wafer treatments are started, the wafers in the cassette on the cassette loading table are immediately ejected in many cases. However, the cassette stands by on the cassette loading table until the wafers are returned from the treatment station, so an additional cassette cannot be loaded on the cassette loading table, although there is an open space for the wafer treatment in the treatment station. As a result, a throughput in the coating/developing apparatus is lowered.

In this case, as a simple countermeasure, the number of cassettes that can be loaded on the loading table may be increased. However, this results in an increase in occupied floor area of the coating/developing apparatus, and requires a structure of the cassette station to be significantly changed.

SUMMARY OF THE INVENTION

The present invention has been made in view of the above-mentioned circumstances, and it is an object to deal with a small-lot treatment without reducing a throughput and without increasing an occupied floor area in a substrate treatment apparatus such as a coating/developing apparatus.

According to an aspect of the present invention, there is provided a substrate treatment apparatus including: a cassette loading portion on which a cassette for containing a substrate is loaded when the cassette is carried to/from outside of the substrate treatment apparatus; a substrate treatment portion for performing a treatment on the substrate; a substrate carrying portion for carrying the substrate in the cassette loaded on the cassette loading portion to the substrate treatment portion, and carrying the substrate that has been subjected to the treatment by the substrate treatment portion to the cassette on the cassette loading portion; a vacant cassette loading portion on which the cassette caused to be vacant by carrying the substrate to the substrate treatment portion is temporarily loaded; and a vacant cassette transfer mechanism for transferring the vacant cassette between the vacant cassette loading portion and the cassette loading portion.

According to the aspect of the present invention, the vacant cassette from which the substrate is carried out can be temporarily loaded on the vacant cassette loading portion from the cassette loading portion. Accordingly, additional cassettes can be sequentially carried in the cassette loading portion, so substrates can be sequentially carried in the substrate treatment portion without time intervals even in a small-lot treatment in which the number of substrates in one cassette is small. As a result, it is possible to deal with the small-lot treatment without lowering a throughput in the substrate treatment apparatus. Further, it is also possible to deal with the small-lot treatment without increasing an occupied floor area of the substrate treatment apparatus. According to the present invention, it is possible to deal with the small-lot treatment without lowering the throughput of the substrate treatment apparatus and without increasing the occupied floor area.

DETAILED DESCRIPTION OF THE INVENTION

Figure 1:
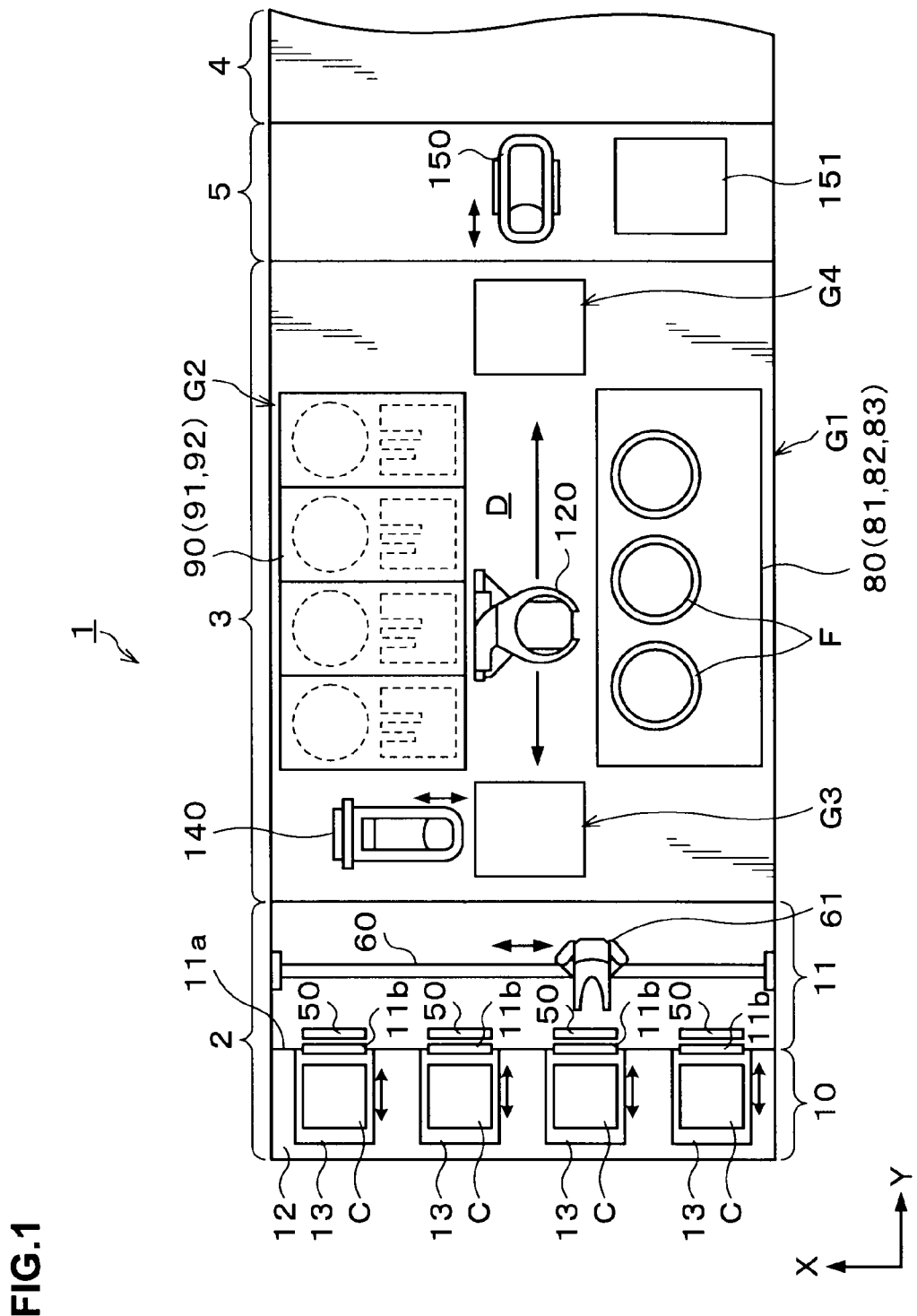
FIG. 1 is an explanatory view schematically showing an inner structure of a coating/developing apparatus.
Figure 2:
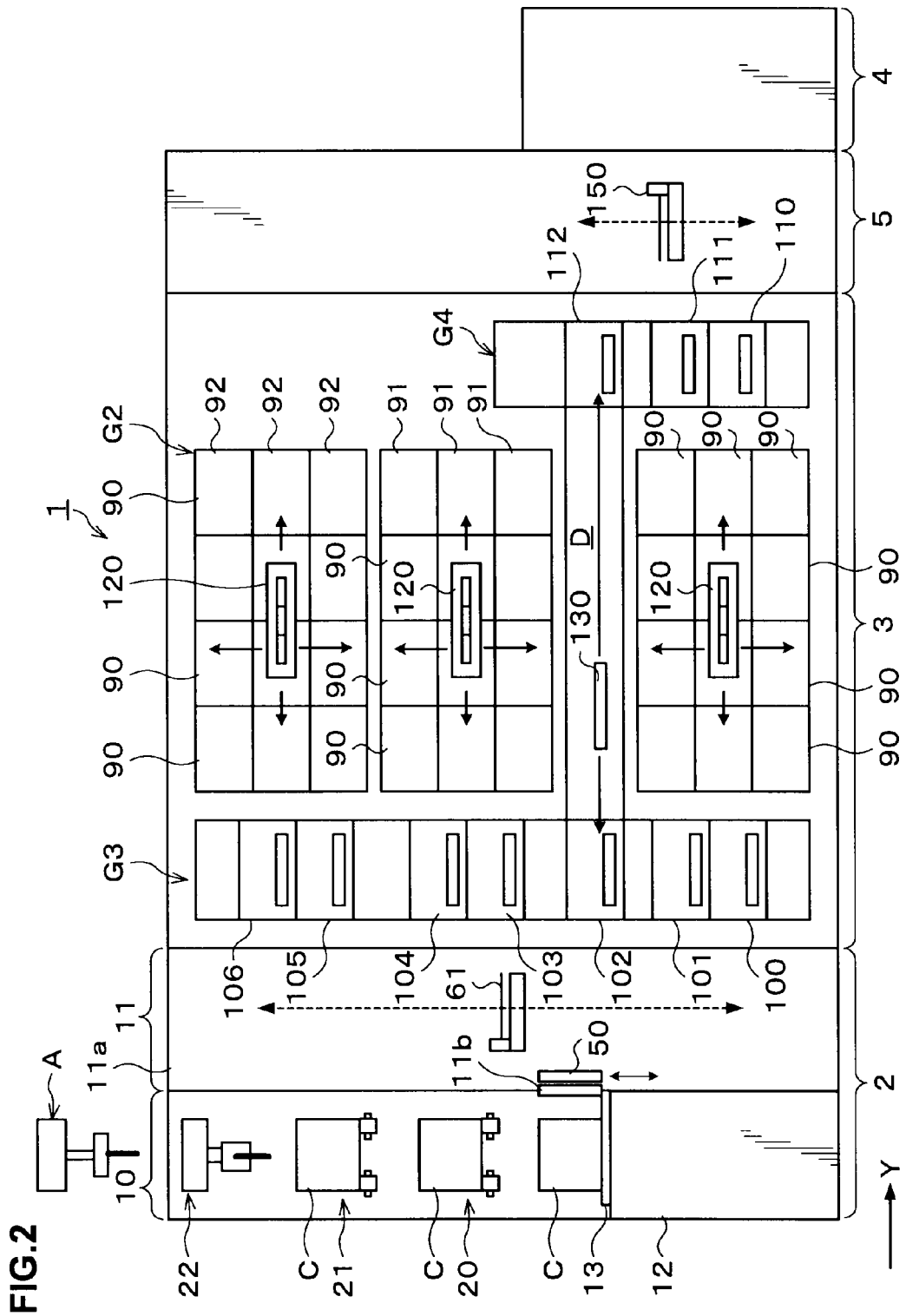
FIG. 2 is a side view schematically showing the inner structure of the coating/developing apparatus.
Figure 3:
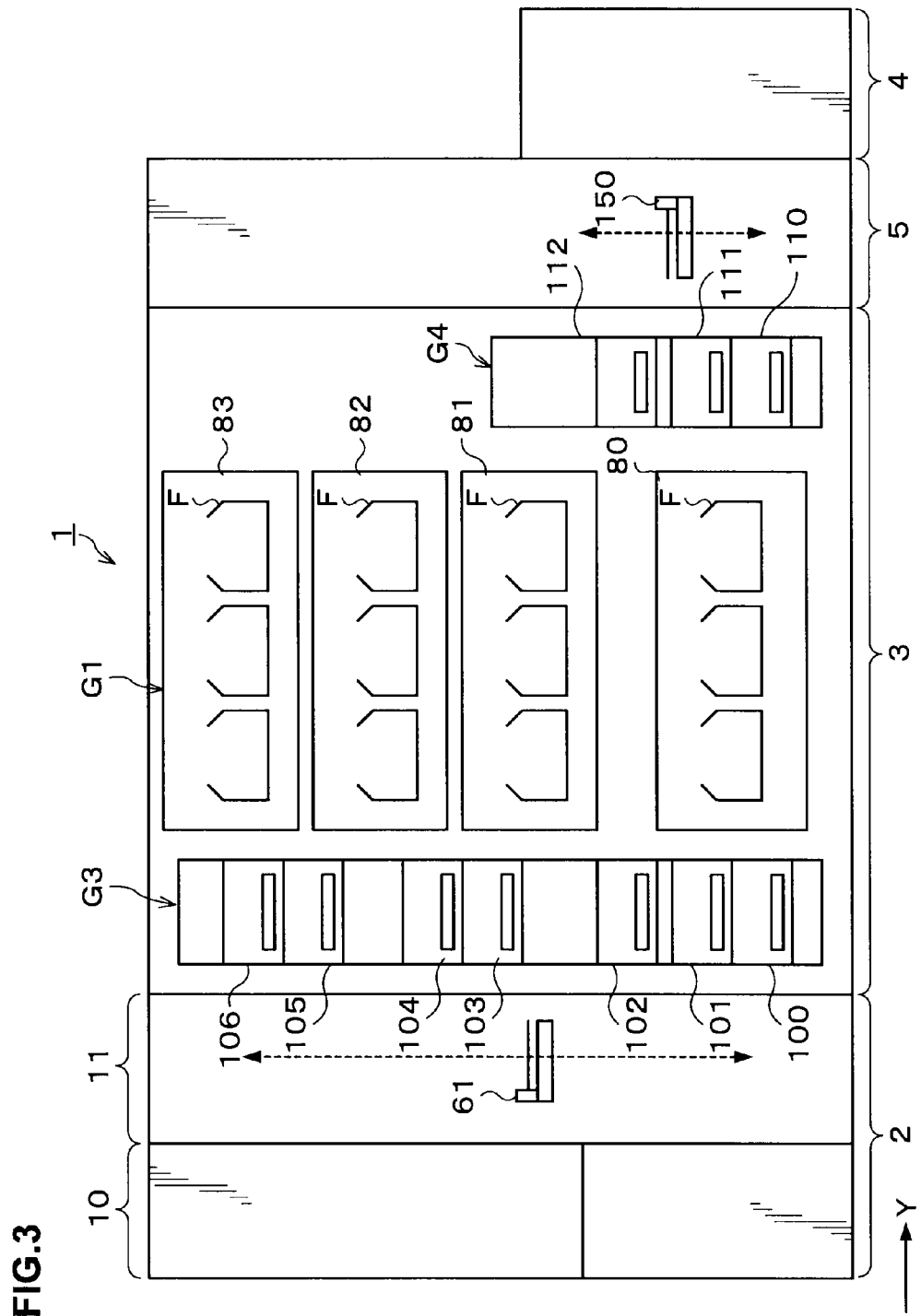
FIG. 3 is a side view schematically showing the inner structure of the coating/developing apparatus.

Hereinafter, embodiments of the present invention will be described. FIG. 1 is an explanatory view schematically showing an inner structure of a coating/developing apparatus 1 as a substrate treatment apparatus according to the present invention. FIGS. 2 and 3 are side views each schematically showing the inner structure of the coating/developing apparatus 1.

As shown in FIG. 1, the coating/developing apparatus 1 has a structure in which a cassette station 2, a treatment station 3, and an interface station 5 are integrally connected to each other. A cassette C is carried to/from the cassette station 2 from/to outside. The treatment station 3 serves as a substrate treatment portion including a plurality of various kinds of treatment units that perform predetermined treatments in a sheet-feed manner in a photolithography. Through the interface station 5 adjacent to the treatment station 3, a wafer W is carried to/received from an exposing apparatus 4.

The cassette station 2 is separated into a cassette carry-in/out portion 10 and a wafer carrying portion 11 as a substrate carrying portion, for example. The cassette carry-in/out portion 10 is provided at an end of the coating/developing apparatus 1 on a negative Y direction side (left-hand side in FIG. 1). On the cassette carry-in/out portion 10, a cassette loading table 12 as a cassette loading portion is provided. On the cassette loading table 12, a plurality of, e.g., four loading plates 13 are provided. The loading plates 13 are horizontally arranged in a line in an X direction. The loading plates 13 each have an approximately rectangular plate shape, for example, and can fix the loaded cassette C in position. In addition, the loading plates 13 can slide in Y direction, for example, and can connect wafer ejection openings for the loaded cassettes C to wafer carrying openings 11b (described later) on the wafer carrying portion 11.

Figure 4:
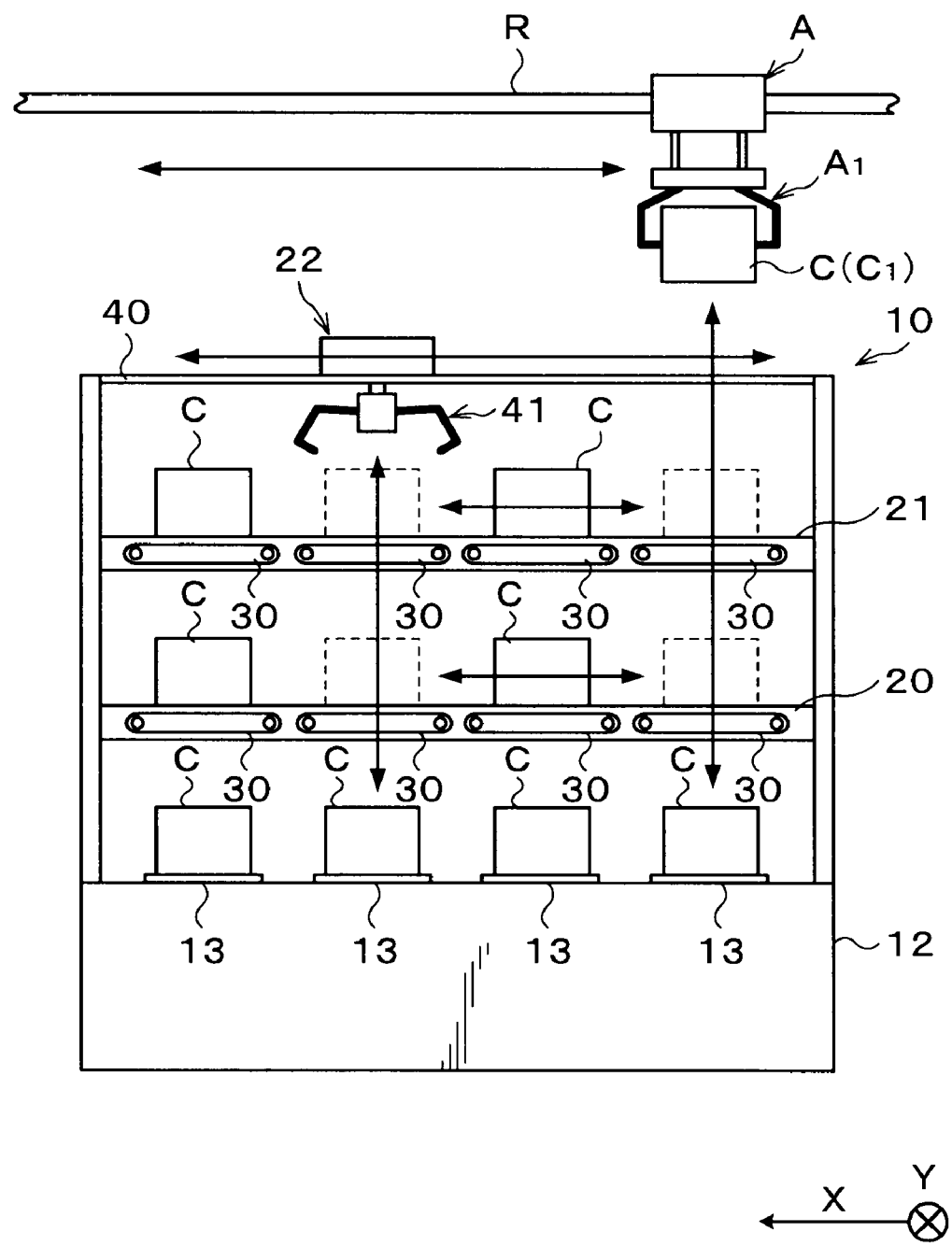
FIG. 4 is a side view showing a structure of a cassette carry-in/out portion of a cassette station.

For example, as shown in FIG. 4, above the cassette carry-in/out portion 10 of the cassette station 2, a rail R is disposed. To the rail R, an external cassette carrying apparatus A for carrying the cassette C between the coating/developing apparatus 1 and another treatment apparatus outside thereof is provided. The external cassette carrying apparatus A can move in the X direction above the cassette carry-in/out portion 10. The external cassette carrying apparatus A includes a cassette holding portion A1 capable of extending vertically. A main body of the external cassette carrying apparatus A moves in an upward direction of a predetermined loading plate 13 on the cassette loading table 12. After that, the cassette holding portion A1 is vertically moved, which can carry the cassette C to the predetermined loading plate 13.

Above the cassette loading table 12 of the cassette carry-in/out portion 10, vacant cassette loading tables 20 and 21 as vacant cassette loading portions are provided in a plurality of, e.g., two, stages. Further above the vacant cassette loading tables 20 and 21, a vacant cassette transfer mechanism 22 is provided.

In each of the vacant cassette loading tables 20 and 21, e.g., four cassette moving apparatuses 30 are provided. The four cassette moving apparatuses 30 are arranged in a line in the X direction so as to correspond to the four loading plates 13 on the cassette loading table 12.

Figure 5:
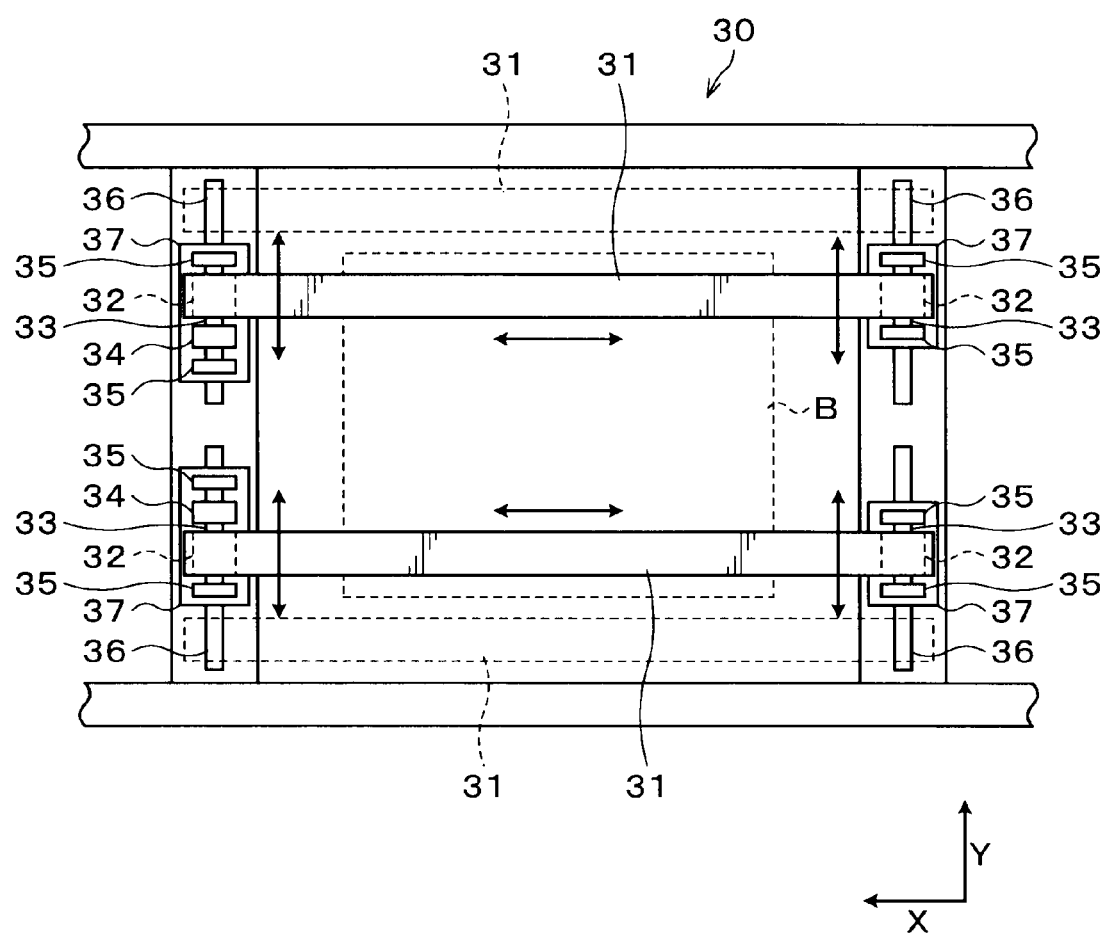
FIG. 5 is a plan view schematically showing a structure of a cassette moving apparatus on a vacant cassette loading table.

For example, as shown in FIG. 5, each of the cassette moving apparatuses 30 has two driving belts 31 that extend in the X direction. The two driving belts 31 are provided in parallel to each other. On the two driving belts 31, the cassette C can be loaded. It should be noted that the two driving belts 31 function as supporting members for supporting a lower surface of the cassette C in this embodiment.

Each of the driving belts 31 are bridged over two pulleys 32 at both ends thereof. To a rotation shaft 33 of one of the pulleys 32, a motor 34 is connected. The motor 34 drives the pulleys 32 to rotate, with the result that the driving belts 31 can rotate in the X direction. Thus, the cassette C loaded on the driving belts 31 can be moved in the X direction.

Figure 6:
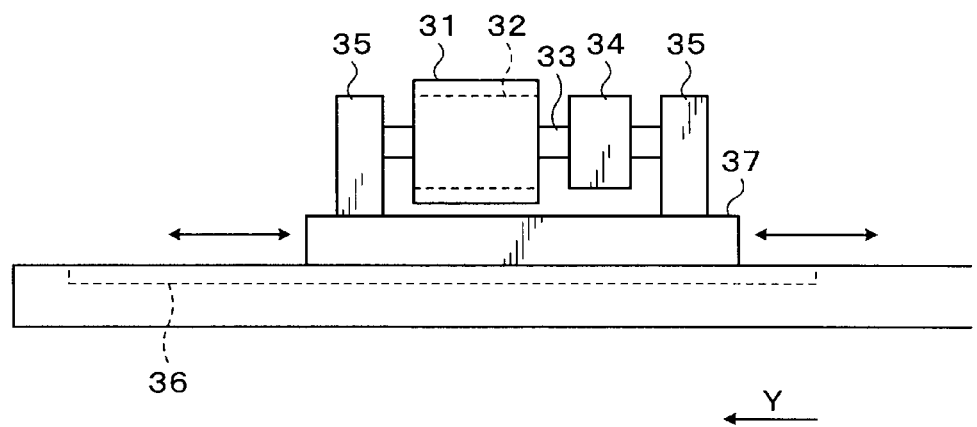
FIG. 6 is an explanatory view showing a structure in which the cassette moving apparatus slides in a Y direction.

For example, as shown in FIG. 6, the rotation shafts 33 of each of the driving belts 31 are rotatably supported by bearing portions 35. For example, the bearing portions 35 are attached to a slider 37 that can be moved by the motor or the like on the rail 36 extending in the Y direction. That is, the driving belt 31 and the motor 34 are provided to the slider 37 through the bearing portions 35. By moving the sliders 37, the driving belts 31 can respectively move in the Y direction, with the result that a distance between the two driving belts 31 can be adjusted. Thus, as shown in FIG. 5, by distancing the two driving belts 31 from each other to make space, a path B (centrally-positioned area surrounded by dotted lines of FIG. 5) through which the cassette holding portion A1 of the external cassette carrying apparatus A and the cassette C carried by the cassette holding portion A1 vertically pass can be formed.

As shown in FIG. 4, the four cassette moving apparatus 30 are provided in proximity to each other. Therefore, the cassette C can be carried to/from the adjacent cassette moving apparatuses 30. As a result, when, for example, the cassette holding portion A1 of the external cassette carrying apparatus A passes through the path B, the loaded cassette C can be moved to the next cassette moving apparatus 30.

Figure 7:
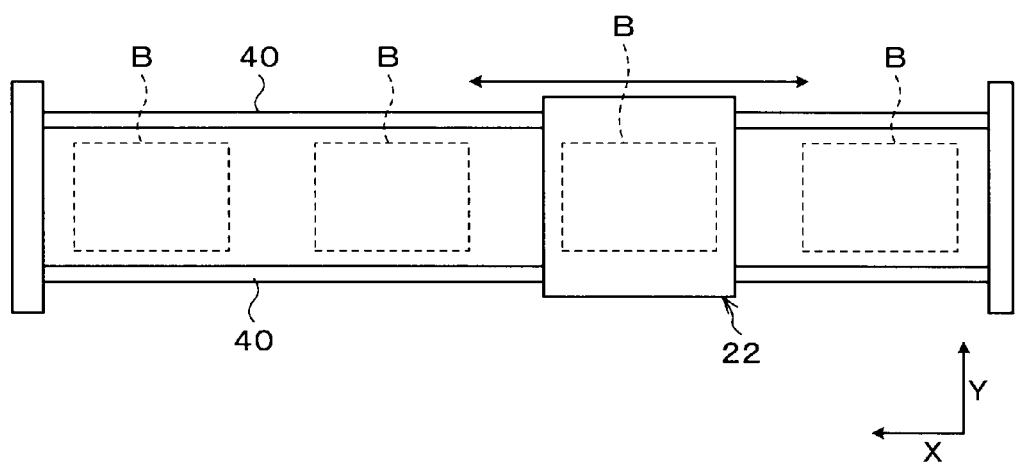
FIG. 7 is a plan view showing a structure of a rail in a cassette transfer mechanism.

For example, as shown in FIG. 4, the vacant cassette transfer mechanism 22 can move on rails 40 that extends in the X direction and is provided on the uppermost portion of the cassette carry-in/out portion 10. As shown in FIG. 7, the number of rails 40 is e.g., two, and the two rails are spaced from each other so as not to hinder the path B for the cassette holding portion A1 and the like. As shown in FIG. 4, the vacant cassette transfer mechanism 22 includes a cassette holding portion 41 capable of extending vertically. The cassette holding portion 41 is formed within such a size that the cassette holding portion 41 can pass through the path B for the external cassette carrying apparatus A and the like. The vacant cassette transfer mechanism 22 vertically moves the cassette holding portion 41, and thus can carry the cassette C onto the loading plates 13 and the cassette moving apparatuses 30 of the vacant cassette loading tables 20 and 21.

As shown in FIGS. 1 and 2, the wafer carrying portion 11 of the cassette station 2 is covered with a casing 11a for controlling atmosphere. At positions corresponding to loading plates 13 on a wall surface of the casing 11a on the cassette carry-in/out portion 10 side, the wafer carrying openings 11b are formed. To each of the wafer carrying opening 11b, a door opener 50 for opening/closing a door of the cassette C on the loading plate 13 is provided.

As shown in FIG. 1, to the wafer carrying portion 11, a wafer carrying apparatus 61 movable on a carrying path 60 extending in the X direction is provided. The wafer carrying apparatus 61 is also movable in the vertical direction and around a vertical axis (in a θ direction). Thus, the wafer W can be carried between the cassette C on each loading plate 13 and a delivery/receipt apparatus of a third block G3 of the treatment station 3 described later.

The treatment station 3 is provided with a plurality of, e.g., four, blocks G1, G2, G3, and G4 including various kinds of units. For example, on a front side (on a negative X direction side in FIG. 1) of the treatment station 3, a first block G1 is provided, while on a back side (on a positive X direction side in FIG. 1) of the treatment station 3, a second block G2 is provided. Further, on a cassette station 2 side (on the negative Y direction side in FIG. 1) of the treatment station 3, a third block G3 is provided. On an interface station 5 side (on a positive Y direction side in FIG. 1) of the treatment station 3, a fourth block G4 is provided.

In the first block G1, for example, as shown in FIG. 3, a plurality of liquid treatment units such as a developing treatment unit 80, a lower-part antireflective film forming unit 81, a resist coating unit 82, and an upper-part antireflective film forming unit 83 are arranged in four stages in the stated order from the bottom. The developing treatment unit 80 performs a developing treatment on the wafer W. The lower-part antireflective film forming unit 81 forms an antireflective film (hereinafter, referred to as "lower-part antireflective film") on a lower layer of the resist film of the wafer W. The resist coating unit 82 forms a resist film by coating a resist solution on the wafer W. The upper-part antireflective film forming unit 83 forms an antireflective film (hereinafter, referred to as "upper-part antireflective film") on an upper layer of the resist film of the wafer W.

For example, each of the units 80 to 83 of the first block G1 horizontally includes a plurality of cups F for containing the wafers W at the time of the treatment, and can perform the treatment on the plurality of wafers in parallel.

For example, as shown in FIG. 2, in the second block G2, a heat treatment unit 90, an adhesion unit 91, and a periphery exposing unit 92 are arranged in the vertical and horizontal directions. The heat treatment unit 90 performs a heat treatment on the wafer W, and includes a hot plate for heating the wafer W loaded thereon and a cooling plate for cooling the wafer W loaded thereon. Therefore, the heat treatment unit 90 can perform both of the heating and cooling treatments. The adhesion unit 91 performs a hydrophobizing treatment on the wafer W. The periphery exposing unit 92 exposes the outer periphery of the wafer W to light. It should be noted that the numbers of the heat treatment unit 90, the adhesion unit 91, and the periphery exposing unit 92, or positions thereof can be arbitrarily selected.

For example, in the third block G3, a plurality of delivery/receipt units 100, 101, 102, 103, 104, 105, and 106 are provided in the stated order from the bottom. In addition, in the fourth block G4, a plurality of delivery/receipt units 110, 111, and 112 are provided in the stated order from the bottom.

As shown in FIG. 1, in an area surrounded by the first block G1 to the fourth block G4, a wafer carrying area D is formed. In the wafer carrying area D, a wafer carrying apparatus 120 is disposed, for example.

The wafer carrying apparatus 120 includes a carrying arm that can move in, e.g., the Y direction, the forward and backward directions, the θ direction, and the vertical direction. The wafer carrying apparatus 120 moves within the wafer carrying area D, and can carry the wafers W to predetermined units in the first block G1, the second block G2, the third block G3, and the fourth block G4 therearound.

For example, as shown in FIG. 2, a plurality of wafer carrying apparatuses 120 are vertically arranged, and thus can carry the wafers W to the predetermined units of the first to fourth blocks G1 to G4 at nearly the same vertical positions as the respective wafer carrying apparatuses.

In the wafer carrying area D, a shuttle carrying apparatus 130 for linearly carrying the wafer W between the third block G3 and the fourth block G4 is provided.

The shuttle carrying apparatus 130 can linearly move in, e.g., the Y direction. The shuttle carrying apparatus 130 moves in the Y direction while supporting the wafer W, with the result that the wafer W can be carried between the delivery/receipt unit 102 of the third block G3 and the delivery/receipt unit 112 of the fourth block G4.

As shown in FIG. 1, on the positive X direction side of the third block G3, a wafer carrying apparatus 140 is provided. The wafer carrying apparatus 140 includes a carrying arm movable in, e.g., the forward and backward directions, the θ direction, and the vertical direction. The wafer carrying apparatus 140 vertically moves while supporting the wafers W, and can carry the wafers W to each of the delivery/receipt units in the third block G3.

To the interface station 5, a wafer carrying apparatus 150 and a delivery/receipt unit 151 are provided. The wafer carrying apparatus 150 includes a carrying arm movable in, e.g., the forward and backward directions, the θ direction, and the vertical direction. The wafer carrying apparatus 150 supports the wafer W with the carrying arm, for example, and can carry the wafers W to each of the delivery/receipt units in the fourth block G4 and the delivery/receipt unit 151.

Next, an operation of the coating/developing apparatus 1 structured as described above will be described.

Figure 8:
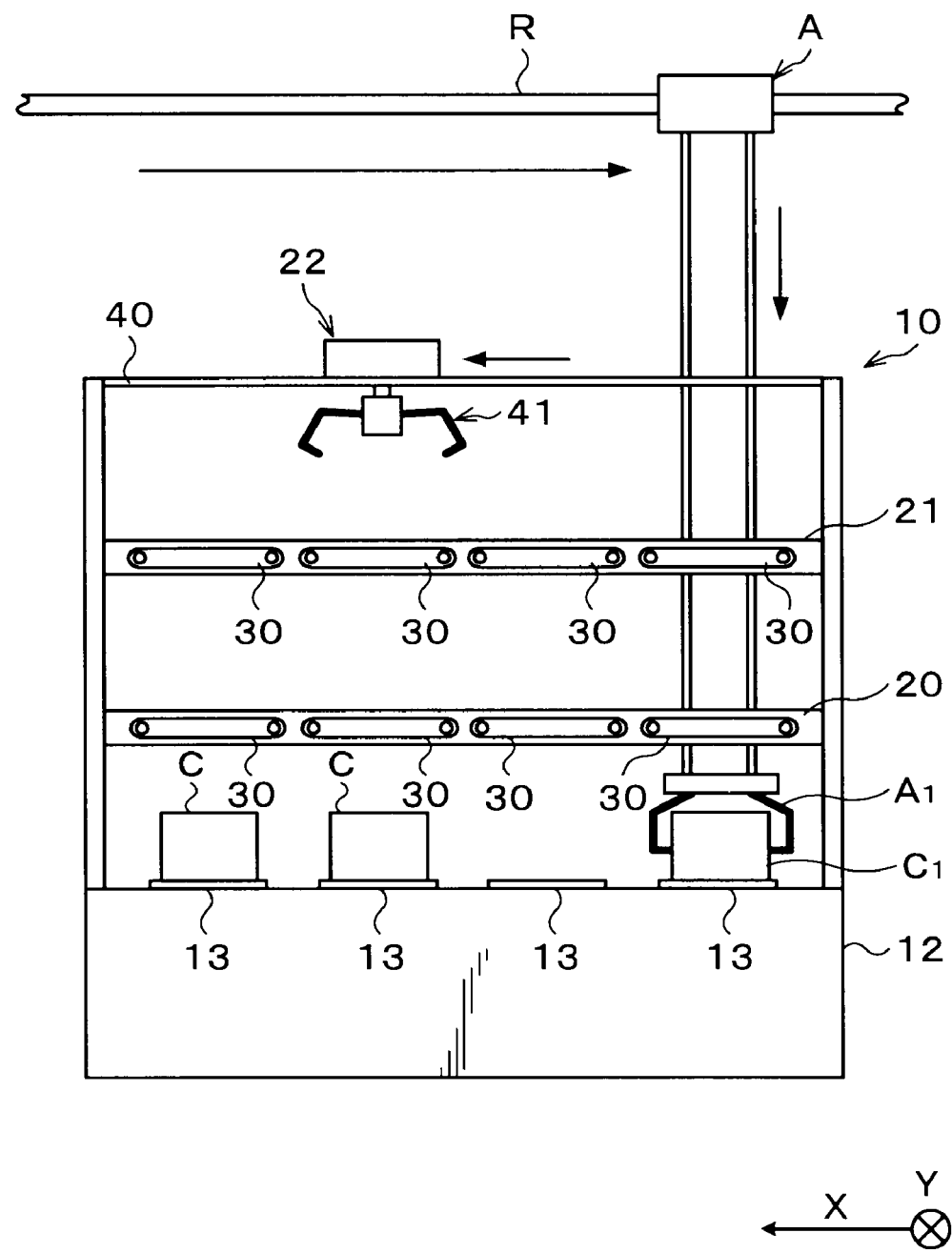
FIG. 8 is an explanatory view showing a state in which an external cassette carrying apparatus carries a cassette onto a cassette loading table.

First, the cassette C1 containing an untreated wafer W of one lot is carried above the cassette carry-in/out portion 10 of the coating/developing apparatus 1 by the external cassette carrying apparatus A, as shown in FIG. 4. After that, as shown in FIG. 8, the cassette holding portion A1 of the external cassette carrying apparatus A extends downward, and the cassette C1 is loaded on a predetermined loading plate 13 of the cassette loading table 12. At this time, the vacant cassette transfer mechanism 22 is evacuated from the path B of the cassette holding portion A1. In addition, the driving belts 31 are distanced outward in the Y direction as indicated by areas surrounded by dotted lines of FIG. 5, thereby causing the cassette moving apparatuses 30 of each of the vacant cassette loading tables 20 and 21 to evacuate from the path B. The cassette holding portion A1 passes through the vacant cassette loading tables 20 and 21, and carries the cassette C1 onto the loading plate 13.

After the cassette C1 is loaded on the loading plate 13 shown in FIG. 1, the loading plate 13 moves to the wafer carrying portion 11 side, and the cassette C1 is set to the wafer carrying opening 11b. Then, the door of the cassette C1 is opened with the door opener 50. After that, the wafers W in the cassette C1 are taken out in sequence by the wafer carrying apparatus 61, and carried into the treatment station 3 to be treated.

Figure 9:
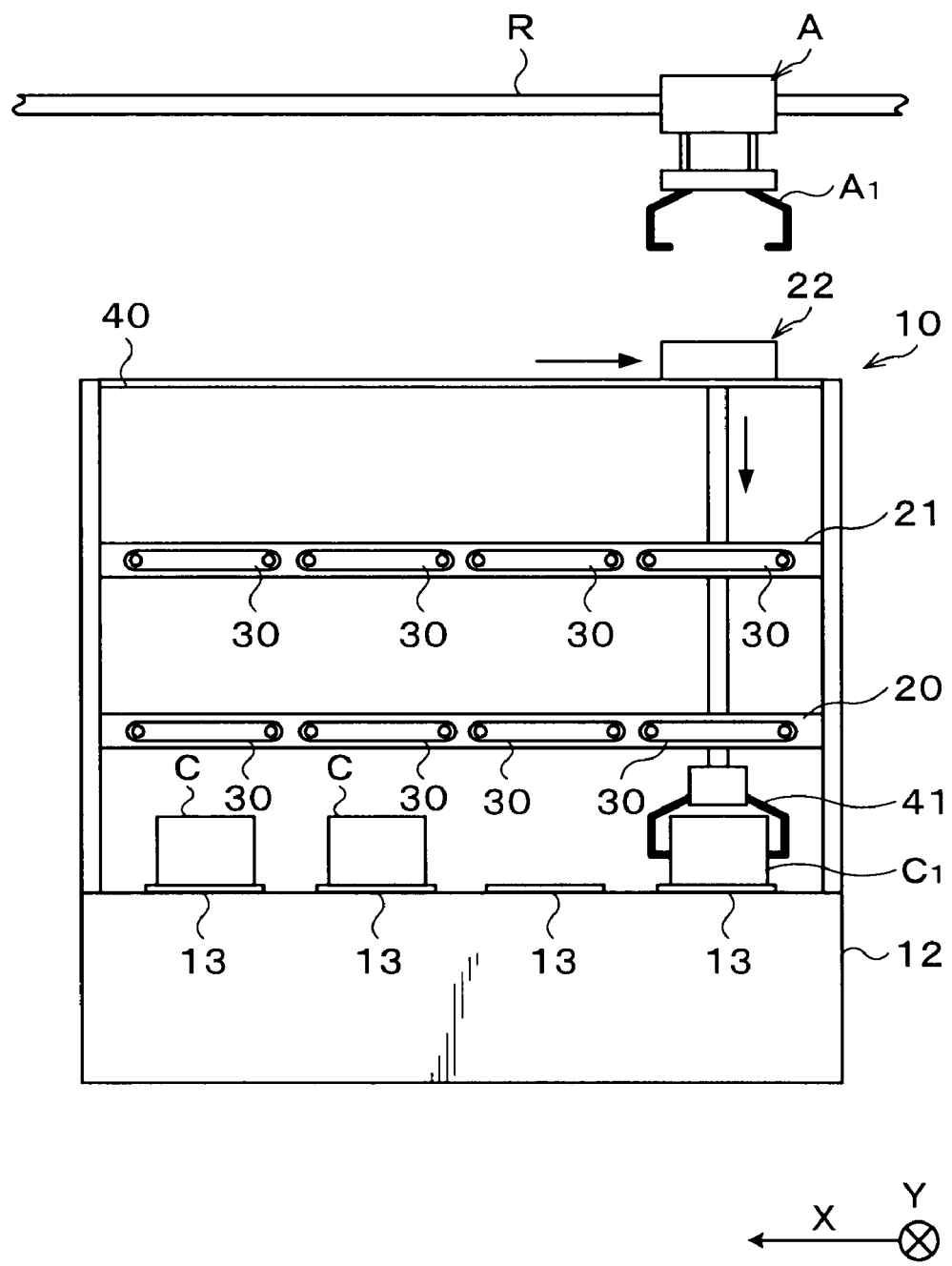
FIG. 9 is an explanatory view showing a state in which the cassette transfer mechanism holds a vacant cassette.

After all the wafers W are carried out of the cassette C1, the vacant cassette C1 is carried to, for example, the vacant cassette loading table 20 by the vacant cassette transfer mechanism 22. At this time, the vacant cassette transfer mechanism 22 moves directly above the cassette C1 first, and the cassette holding portion 41 of the vacant cassette transfer mechanism 22 extends downward to hold the vacant cassette C1 as shown in FIG. 9. In this case, the driving belts 31 of the cassette moving apparatuses 30 of the vacant cassette loading tables 20 and 21 are distanced outward, to thereby secure the path B.

Figure 10:
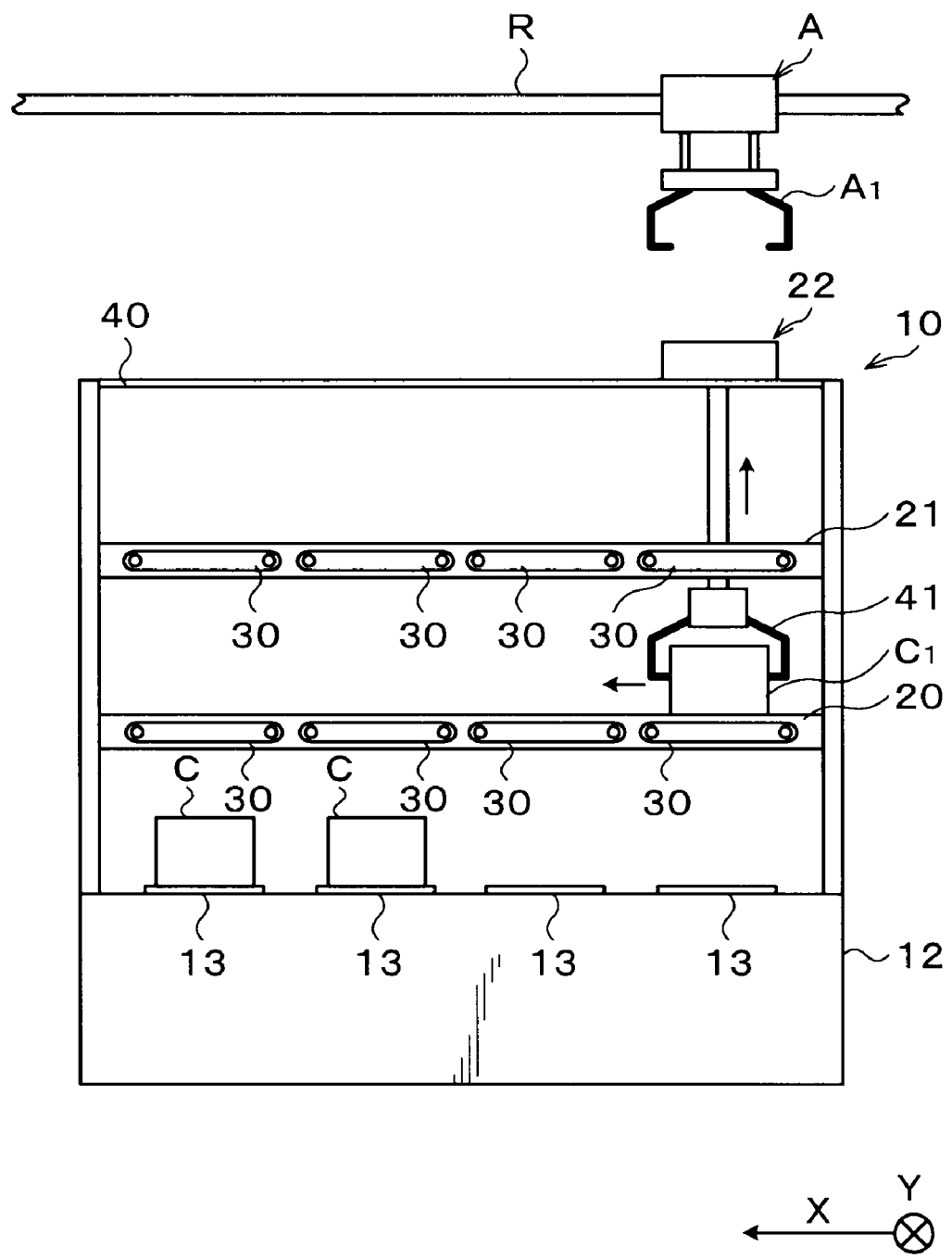
FIG. 10 is an explanatory view showing a state in which the cassette transfer mechanism loads the vacant cassette onto a vacant cassette holding table.

Subsequently, the cassette holding portion 41 holds up the vacant cassette C1 above the vacant cassette loading table 20, and the distance between the driving belts 31 of the cassette moving apparatuses 30 is shortened. Then, as shown in FIG. 10, the vacant cassette C1 is loaded on the cassette moving apparatus 30 of the vacant cassette loading table 20. In this way, the vacant cassette C1 is loaded and stored temporarily on the vacant cassette loading table 20 during a treatment of the lot of the wafer W.

Figure 11:
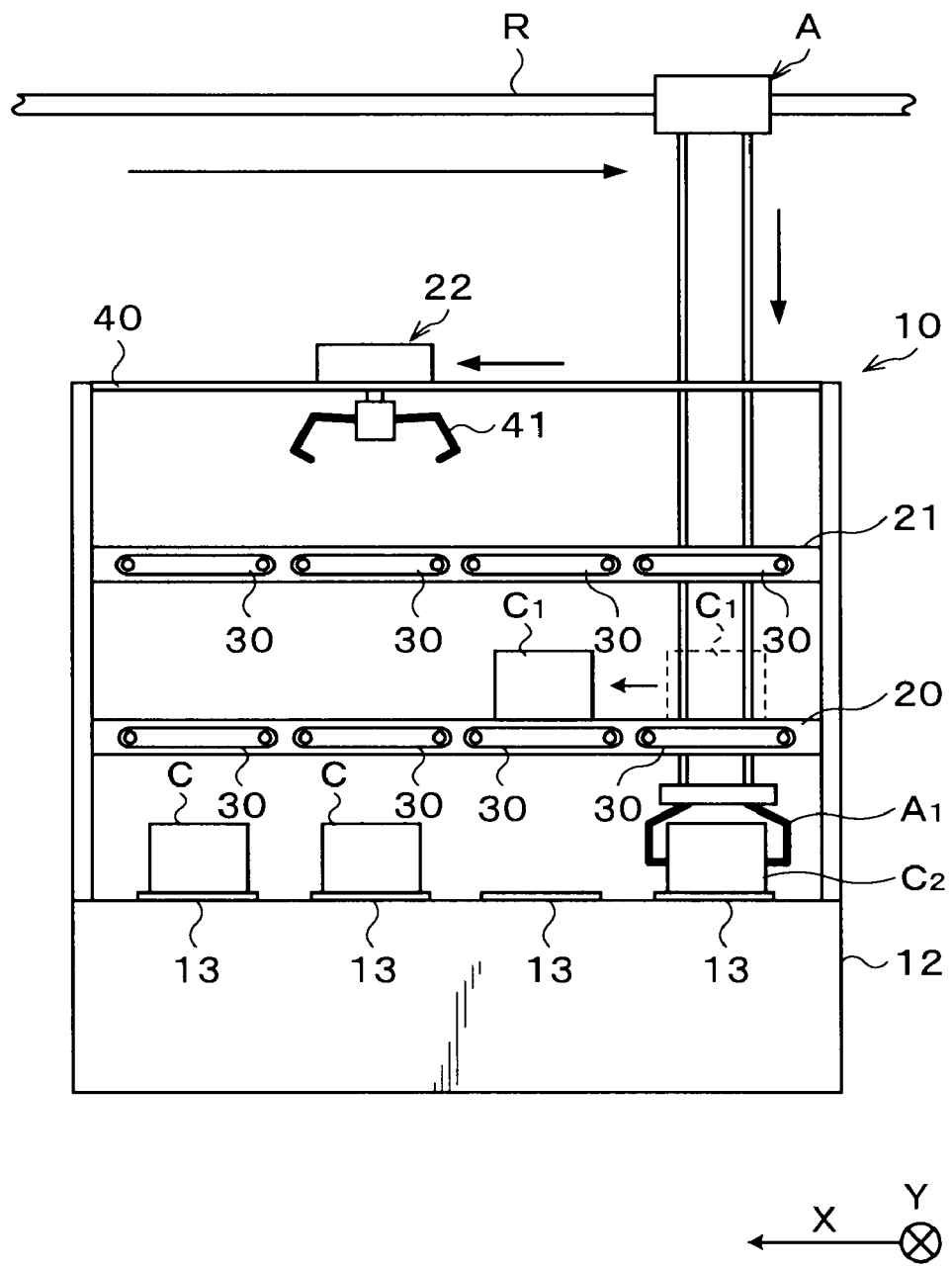
FIG. 11 is an explanatory view showing a state in which the external cassette carrying apparatus carries a next cassette onto a cassette loading table.

When the vacant cassette C1 is loaded on the vacant cassette loading table 20, a cassette C2 of a new lot is carried onto the loading plate 13 by the external cassette carrying apparatus A as shown in FIG. 11. At this time, when the vacant cassette C1 is positioned on the path B for the external cassette carrying apparatus A, the driving belts 31 of the cassette moving apparatus 30 are operated to carry the vacant cassette C1 onto the driving belts 31 of the next cassette moving apparatus 30. As a result, the path B for the external cassette carrying apparatus A is secured, and the new cassette C2 can be carried onto the loading plate 13.

Figure 12:
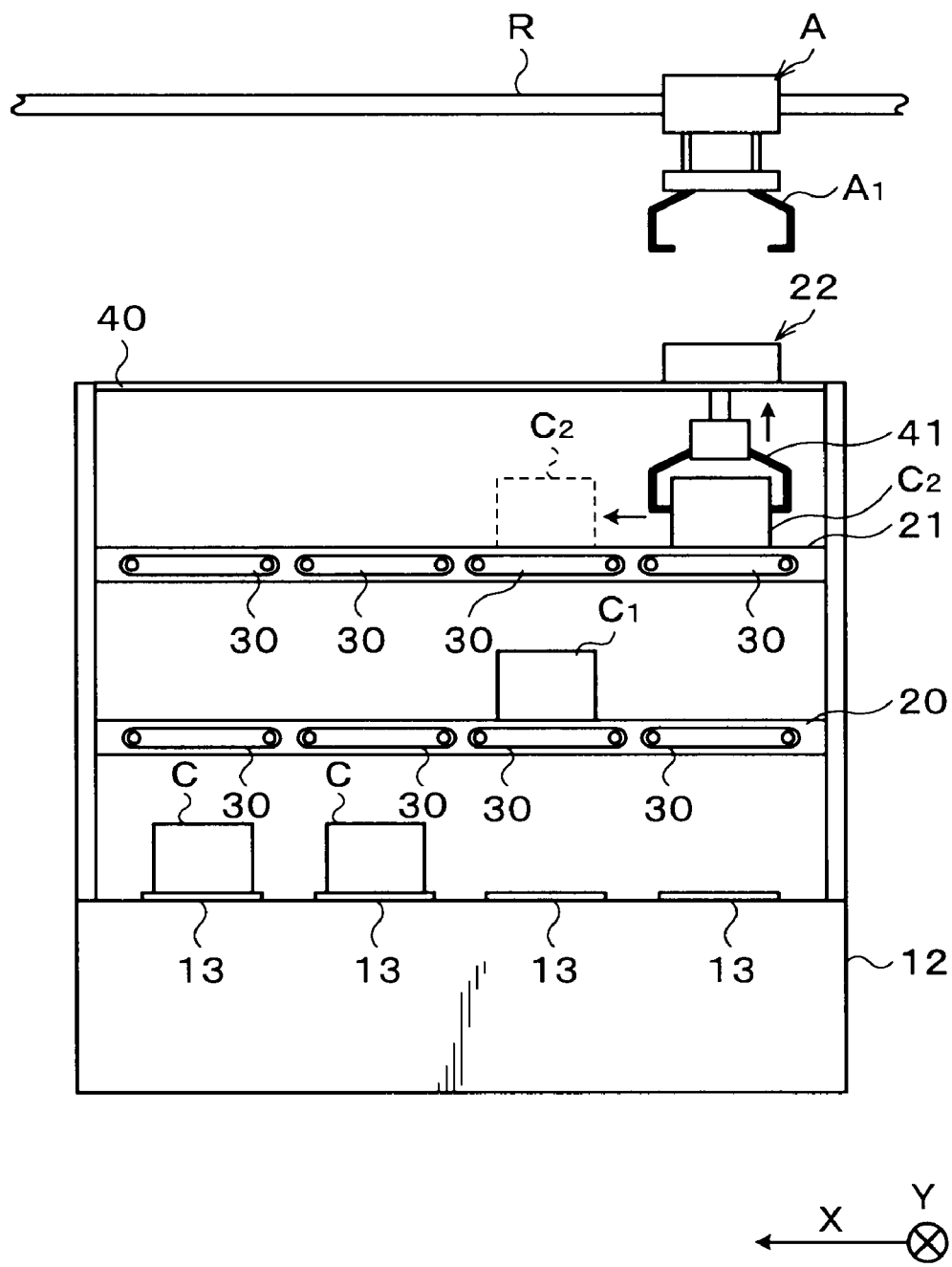
FIG. 12 is an explanatory view showing a state in which the cassette transfer mechanism loads the next cassette onto a vacant cassette loading table.

After all the wafers W are carried to the treatment station 3 as in the case of the cassette C1, the cassette C2 that has been carried onto the loading plate 13 is carried onto, for example, the vacant cassette loading table 21 by the vacant cassette transfer mechanism 22, as shown in FIG. 12. After that, the cassette C2 is transferred to the adjacent cassette moving apparatus 30 in order to secure the path B as necessary. As described above, the wafers W are carried out on the loading plate 13 to cause the cassettes C to be vacant, and the vacant cassettes C are carried onto the vacant cassette loading table 20 or 21 and loaded and stored temporarily.

On the other hand, the wafers W in the cassette C1 that have been carried to the treatment station 3 are carried sequentially to the heat treatment unit 90, the lower-part antireflective film forming unit 81, the heat treatment unit 90, the adhesion unit 91, the resist coating unit 82, the heat treatment unit 90, the upper-part antireflective film forming unit 83, the heat treatment unit 90, the periphery exposing unit 92, and the like, and are subjected to predetermined treatments in the respective units. After that, the wafers W are carried to the exposing apparatus 4 and subjected to an exposure treatment, and then returned to the treatment station 3. After that, the wafers W are carried sequentially to the heat treatment unit 90, the developing treatment unit 80, the heat treatment unit 90, and the like, and are subjected to predetermined treatments in the respective units. In this way, a series of processes (photolithography processes) with respect to the wafers W are ended.

Figure 13:
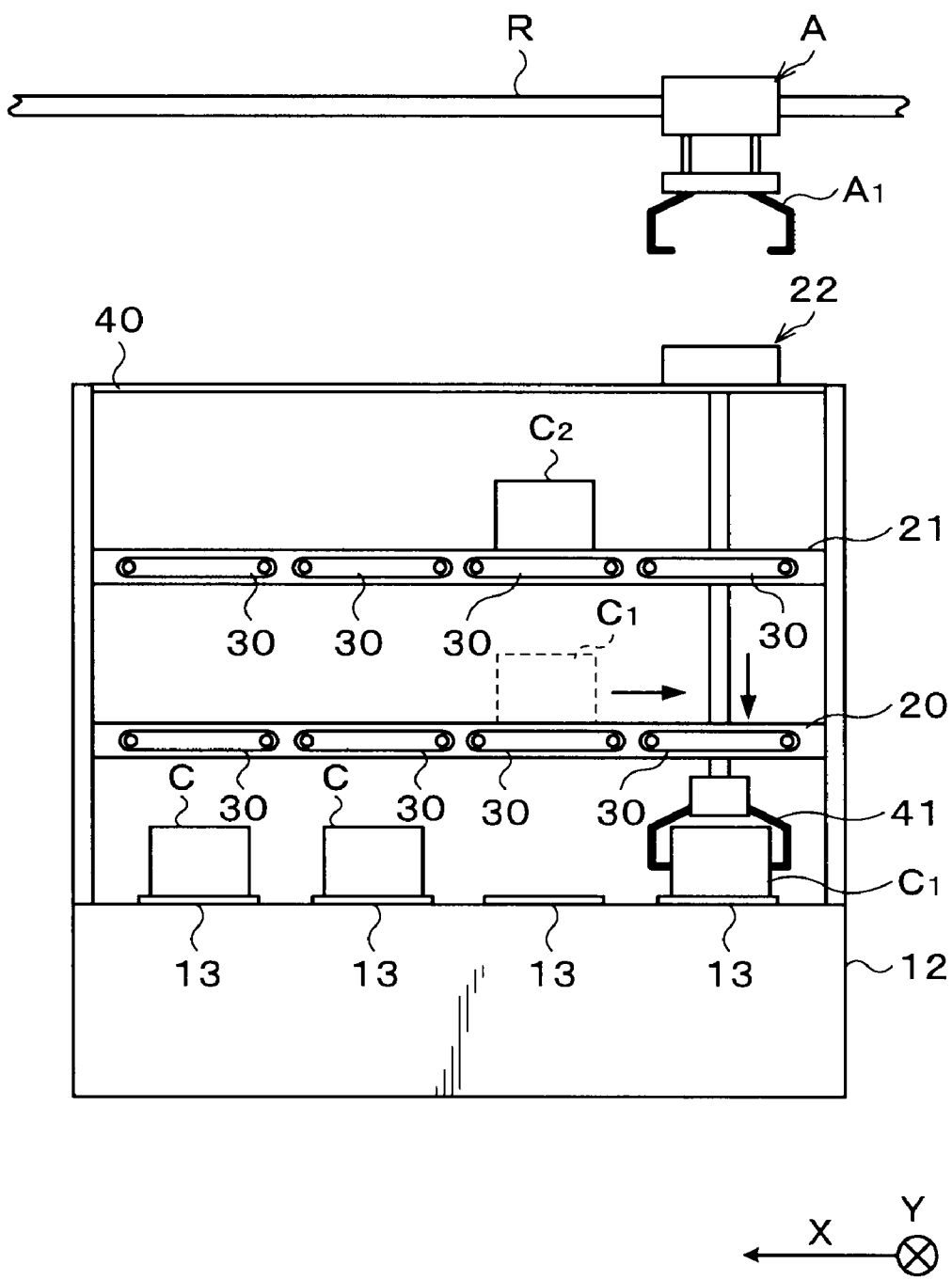
FIG. 13 is an explanatory view showing a state in which the cassette transfer mechanism carries the vacant cassette onto the cassette loading table.

When the series of processes performed on the wafers W is ended, the vacant cassette C1 temporarily loaded on the vacant cassette loading table 20 is returned to the original loading plate 13 by the vacant cassette transfer mechanism 22 as shown in FIG. 13. At this time, when the vacant cassette C1 is carried to the adjacent cassette moving apparatus 30, the vacant cassette C1 is returned to the cassette moving apparatus 30 directly above the original loading plate 13, and then loaded onto the original loading plate 13 by the vacant cassette transfer mechanism 22. In this case, the driving belts 31 of the cassette moving apparatus 30 are distanced outward, to thereby secure the path B. In addition, in a case, for example, where the cassette C2 on the vacant cassette loading table 21 hinders the path B, the cassette C2 is moved to the next cassette moving apparatus 30.

After the cassette C1 is returned to the original loading plate 13, the wafers W that have been subjected to the treatment are returned to the original cassette C1 by the wafer carrying apparatus 61.

Figure 14:
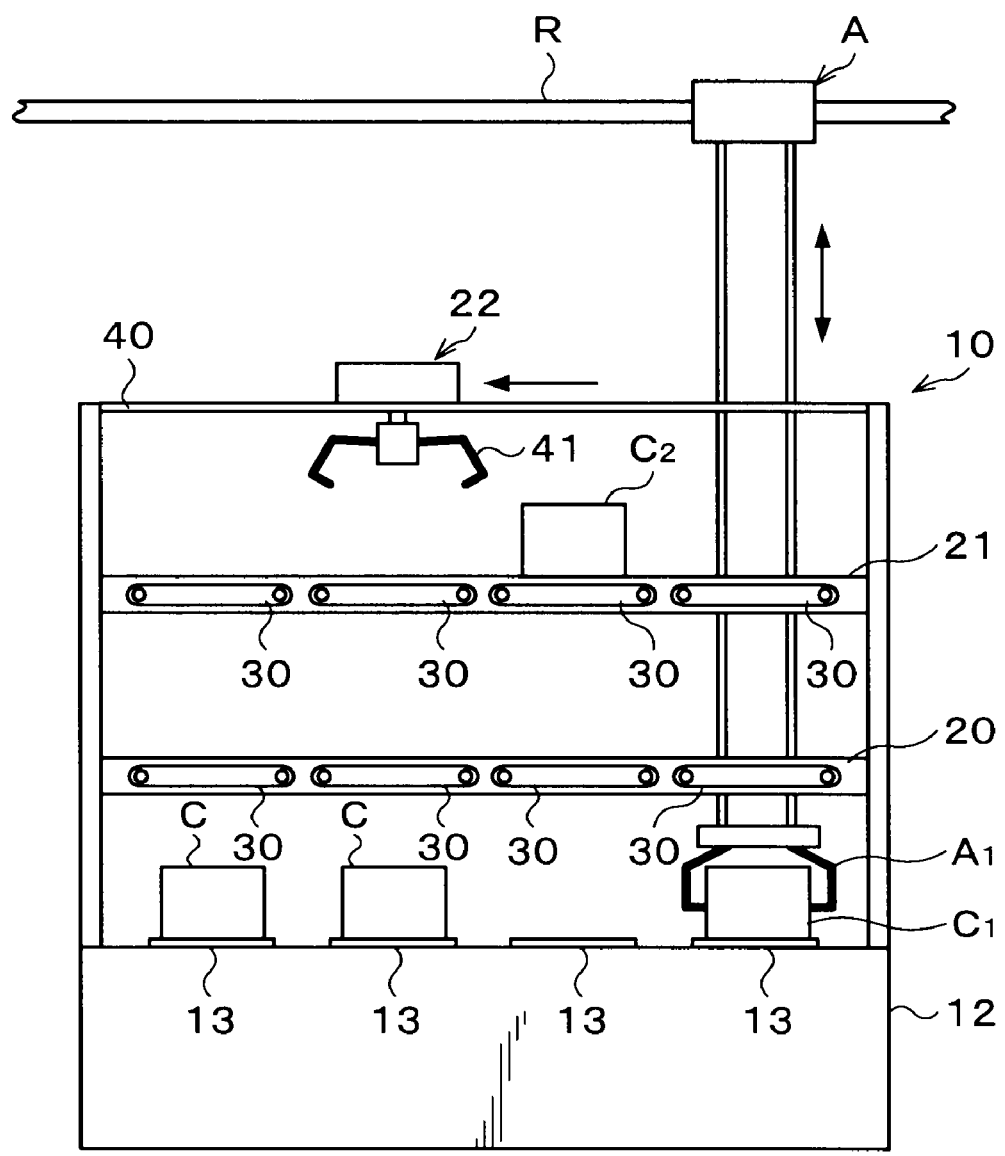
FIG. 14 is an explanatory view showing a state in which the external cassette carrying apparatus carries the cassette out.

After that, as shown in FIG. 14, the cassette holding portion A1 of the external cassette carrying apparatus A moves downward to thereby hold the cassette C1 on the loading plate 13. After that, the cassette holding portion A1 moves upward, and thus the cassette C1 is carried out of the coating/developing apparatus 1.

The cassette C2 is also returned to the original loading plate 13 by the vacant cassette transfer mechanism 22 when the treatment on the wafers W is ended. After all the wafers W are contained, the cassette C2 is carried out of the coating/developing apparatus 1 by the external cassette carrying apparatus A.

According to the above embodiment, the vacant cassette loading tables 20 and 21 and the vacant cassette transfer mechanism 22 are provided to the cassette carry-in/out portion 10 of the coating/developing apparatus 1, with the result that the cassettes C caused to be vacant during the treatment of the lots can be unloaded from the loading plate 13 and temporarily stored on the vacant cassette loading tables 20 and 21. Therefore, new cassettes C can be sequentially carried onto the loading plate 13, with the result that the wafers W can be sequentially carried into the treatment station 3 with no time interval in a "small-lot treatment" in which a small number of wafers are treated in one cassette. Consequently, it is possible to deal with the small-lot treatment without throughput reduction in the coating/developing apparatus 1. Further, it is also possible to deal with the small-lot treatment without increasing the number of the loading plates 13 of the cassette loading table 12 and without increasing an occupied floor area of the coating/developing apparatus 1. In addition, the cassettes C can be carried in an existing way between the external cassette carrying apparatus A and the cassette loading table 12. Therefore, there is no need to change control of carrying in/out the cassettes C by the external cassette carrying apparatus A, thereby making it possible to deal with the small-lot treatment relatively easily.

In the above embodiment, the vacant cassette loading tables 20 and 21 and the vacant cassette transfer mechanism 22 are provided directly above the cassette loading table 12. Therefore, increase in the occupied floor area by providing the vacant cassette loading tables 20 and 21 and the like can be prevented. Further, the vacant cassette loading tables 20 and 21 are structured so that the external cassette carrying apparatus A or the cassettes C carried by the external cassette carrying apparatus A can vertically move, with the result that the cassettes C can be appropriately carried in/out by using the existing external cassette carrying apparatus A.

The vacant cassette loading tables 20 and 21 each include the driving belts 31 for supporting the cassettes C. Each of the driving belts 31 is structured so as to move in the Y direction to evacuate to the outside of the path B. Thus, supporting the cassettes C and securing the path B for the external cassette carrying apparatus A and the like can be appropriately performed.

On the vacant cassette loading tables 20 and 21, four cassette moving apparatuses 30 for moving the cassettes C in the X direction are arranged, thereby making it possible to carry the cassettes C between the cassette moving apparatuses 30. Therefore, for example, a vacant cassette C loaded is carried to the next cassette moving apparatus 30, which can secure the path B for the external cassette carrying apparatus A and the like. Accordingly, new cassettes C can be sequentially carried on the cassette loading table 12 by the external cassette carrying apparatus A.

The vacant cassette loading tables 20 and 21 are arranged in a plurality of stages in the vertical direction, so a large number of vacant cassettes C can be stored, and thus new cassettes C can be carried on the cassette loading table 12. As a result, it is possible to deal with a smaller-lot treatment.

The vacant cassette transfer mechanism 22 can carry the cassettes C through the path B for the external cassette carrying apparatus A and the like. Therefore, even in a case where the vacant cassette transfer mechanism 22 is provided above the vacant cassette loading tables 20 and 21, the cassettes C can be transferred appropriately. Further, the vacant cassette transfer mechanism 22 can horizontally move so as not to hinder the path B for the external cassette carrying apparatus A and the like, with the result that the cassettes C by the external cassette carrying apparatus A can be carried in/out appropriately.

It should be noted that the number of layered stages of the vacant cassette loading tables in the treatment station 2 described in the above embodiment is not limited to two, but may be three or more. Further, the number of the cassette moving apparatuses 30 of each of the vacant cassette loading tables 20 and 21 can be arbitrarily selected according to the number of the loading plates 13. In the above embodiment, the driving belts 31 serve as cassette supporting members of the cassette moving apparatus 30, but differently structured supporting members may be employed. Also, the moving belts 31 are used for moving the cassettes C in the cassette moving apparatus 30, but another driving mechanism may used.

Figure 15:
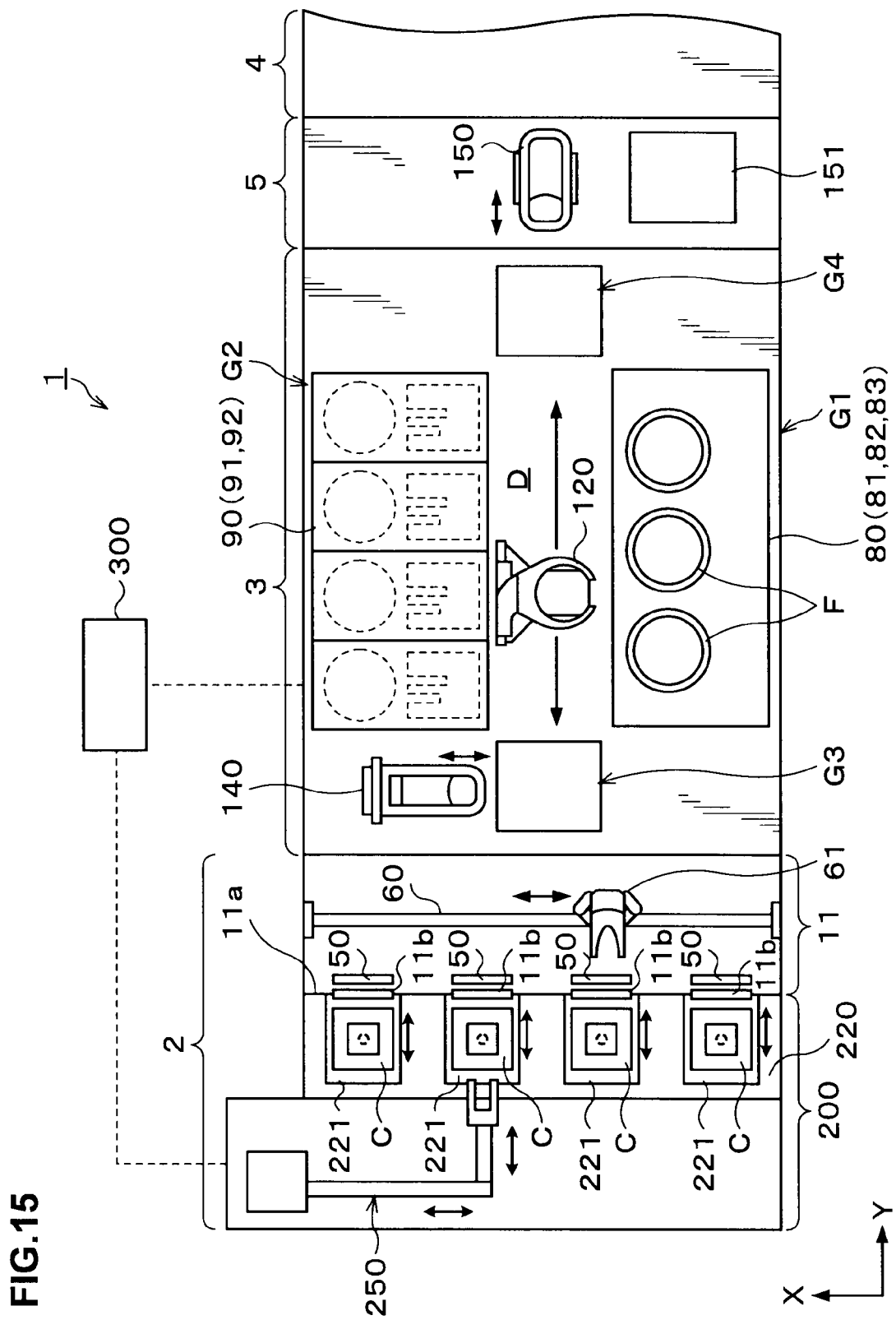
FIG. 15 is an explanatory view schematically showing an inner structure of the coating/developing apparatus according to another embodiment of the present invention.
Figure 16:
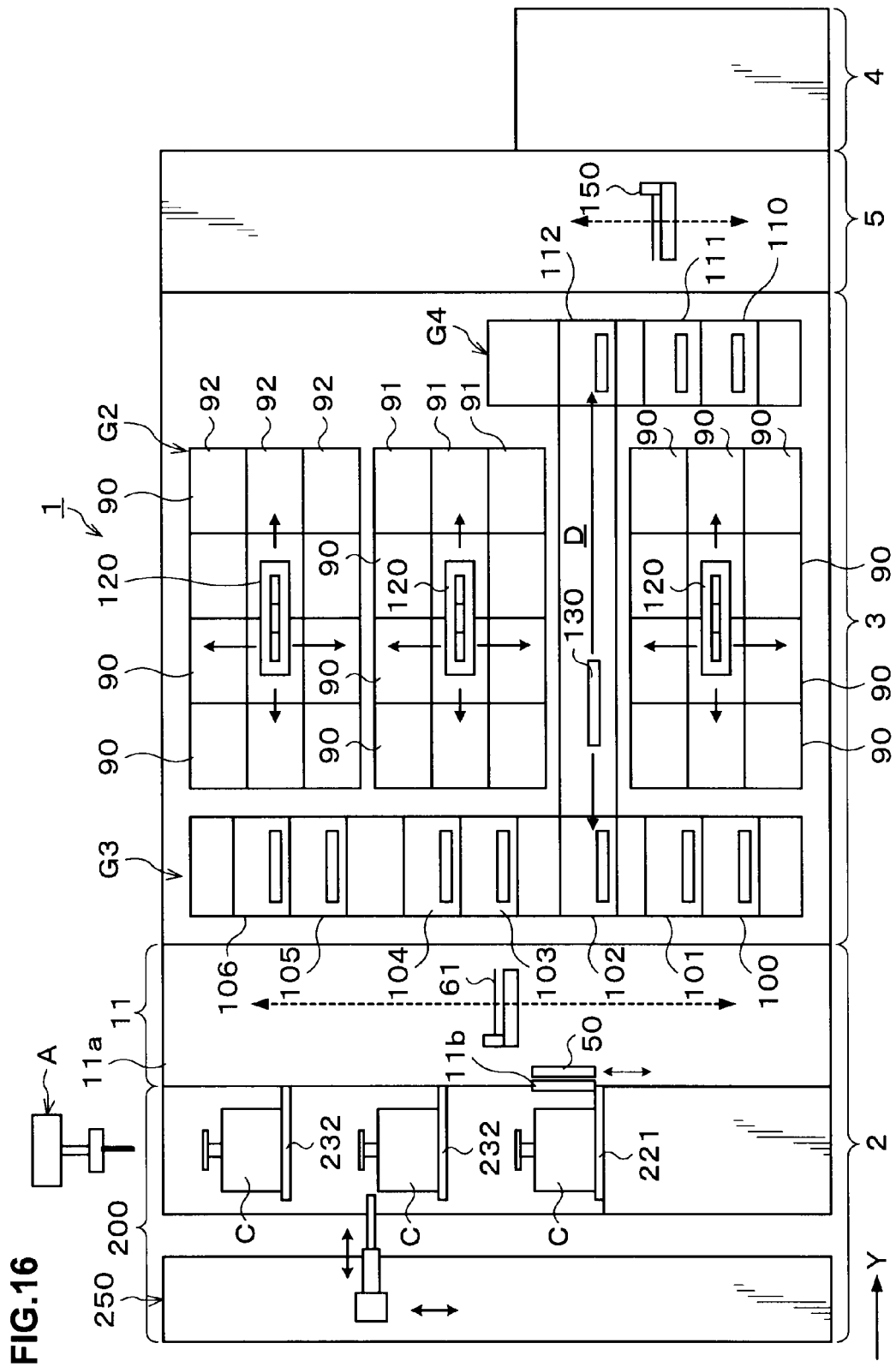
FIG. 16 is a side view schematically showing the inner structure of the coating/developing apparatus.
Figure 17:
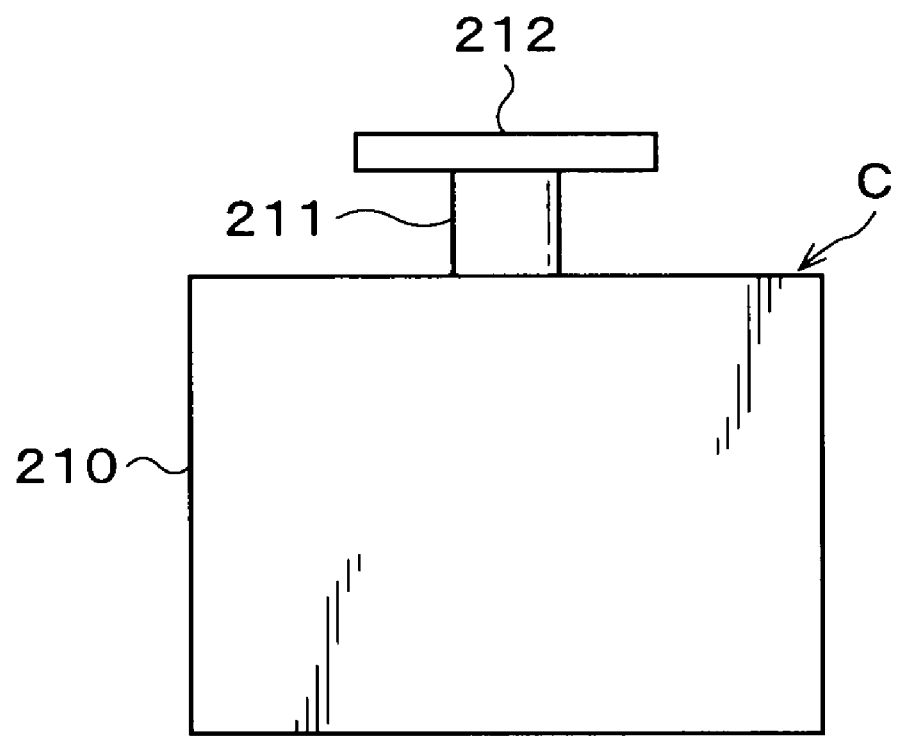
FIG. 17 is a side view of a cassette.

Next, the coating/developing apparatus 1 on which a cassette carry-in/out portion 200 shown in FIG. 15 is mounted will be described as another embodiment of the cassette carry-in/out portion 10 described in the above embodiment. FIG. 15 is an explanatory view schematically showing an inner structure of the coating/developing apparatus 1 according to this embodiment of the present invention. FIG. 16 is a side view schematically showing the inner structure of the coating/developing apparatus 1. As shown in FIG. 17, the cassette C of this embodiment includes a main body portion 210, a shaft 211, and a locked portion 212. The main body portion 210 contains the wafers W. The shaft 211 protrudes from an upper surface of the main body portion 210. The locked portion 212 is supported by the shaft 211. The locked portion 212 has an approximately rectangular-plate shape, and a side thereof is longer than the diameter of the shaft 211.

As shown in FIG. 15, the cassette carry-in/out portion 200 is provided at an end portion of the coating/developing apparatus 1 on the negative Y direction side (left-hand side in FIG. 15), for example. The cassette carry-in/out portion 200 is provided with a cassette loading table 220 as a cassette loading portion. On the cassette loading table 220, a plurality of, e.g., four loading plates 221 are provided. The loading plates 221 are horizontally arranged in a line in the X direction. The loading plates 221 each have an approximately rectangular-plate shape, and can fix loaded cassette C in position. The loading plates 221 each can slide in the Y direction, for example, and the wafer ejection opening of the loaded cassette C can be connected to the wafer carrying opening 11b on the wafer carrying portion 11 side.

Figure 18:
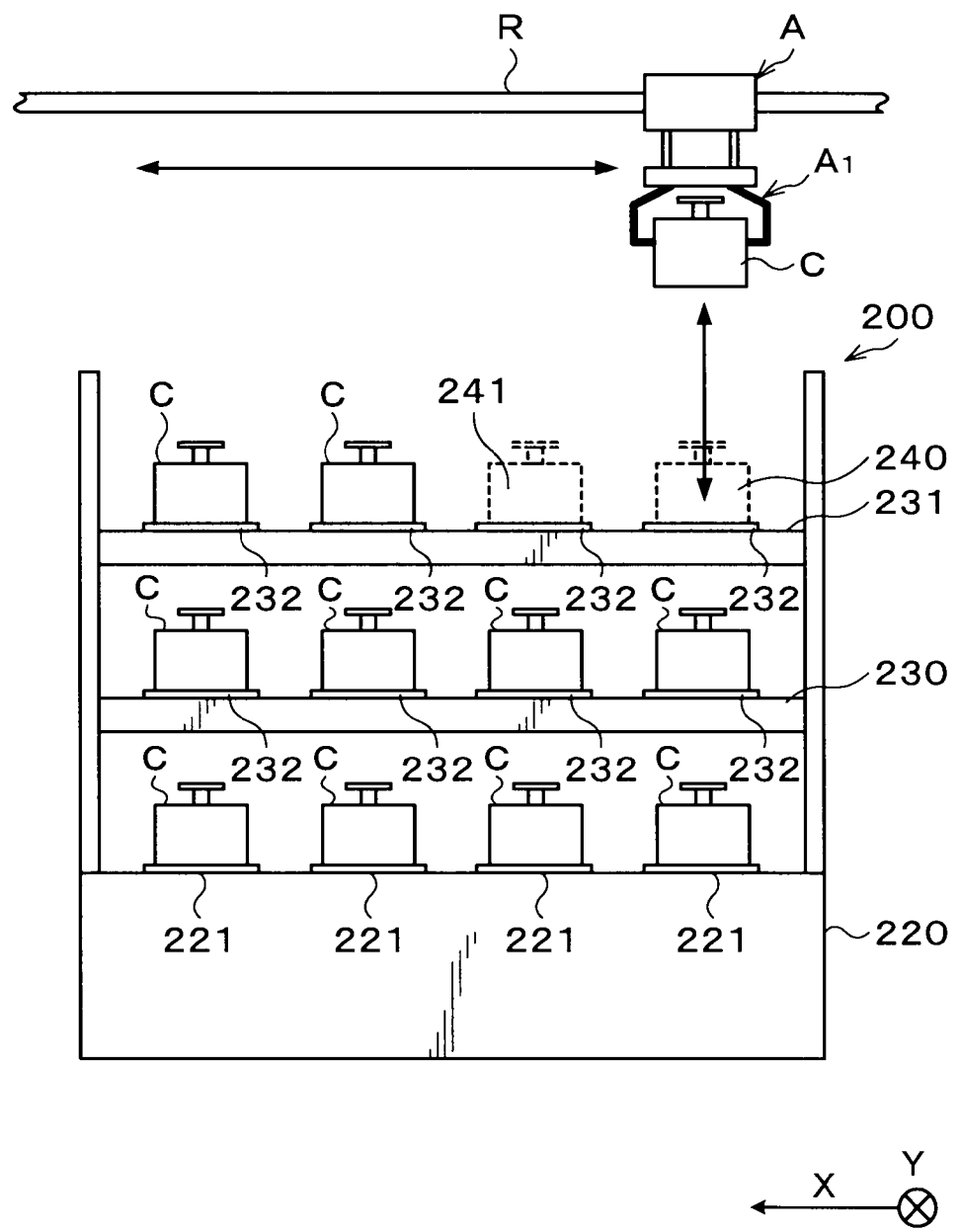
FIG. 18 is a side view showing a structure a cassette carry-in/out portion of a cassette station.

As shown in FIG. 18, above the cassette loading table 220 of the cassette carry-in/out portion 200, vacant cassette loading tables 230 and 231 as vacant cassette loading portions are provided in a plurality of, e.g., two stages in the vertical direction. On the vacant cassette loading tables 230 and 231, a plurality of, e.g., four loading plates 232 are provided. The four loading plates 232 are arranged in the X direction so that the loading plates 232 respectively correspond to the four loading plates 221 of the cassette loading table 220. The loading plates 232 each have an approximately rectangular-plate shape, and can fix the loaded cassette C in position.

Out of the four loading plates 232 provided on the vacant cassette loading table 231 in the upper stage, open spaces of two loading plates into which the cassettes C are loaded function as a carry-in space 240 and a carry-out space 241 for carrying the cassette C from/to the outside of the coating/developing apparatus 1.

Above the vacant cassette loading table 231 in the upper stage, the rail R is provided. On the rail R, the external cassette carrying apparatus A for carrying the cassette C between the coating/developing apparatus 1 and another external treatment apparatus is provided. The external cassette carrying apparatus A can move in the X direction above the vacant cassette loading table 231. The external cassette carrying apparatus A includes the cassette holding portion A1 capable of extending in the vertical direction, for example. The main body of the external cassette carrying apparatus A moves above the carry-in space 240 or the carry-out space 241 on the vacant cassette loading table 231, and thereafter moves the cassette holding portion A1 in the vertical direction, which can carry the cassette C to the carry-in space 240 or the carry-out space 241.

As shown in FIG. 15, the cassette carry-in/out portion 200 is provided with a vacant cassette transfer mechanism 250 on the negative Y direction side (left-hand side in FIG. 15) of the cassette loading table 220.

Figure 19:
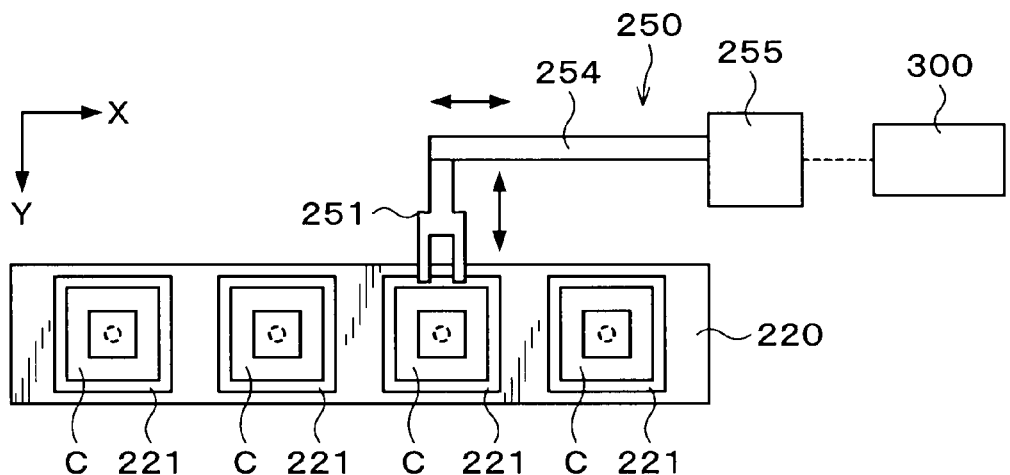
FIG. 19 is a plan view schematically showing a structure of a vacant cassette transfer mechanism.
Figure 20:
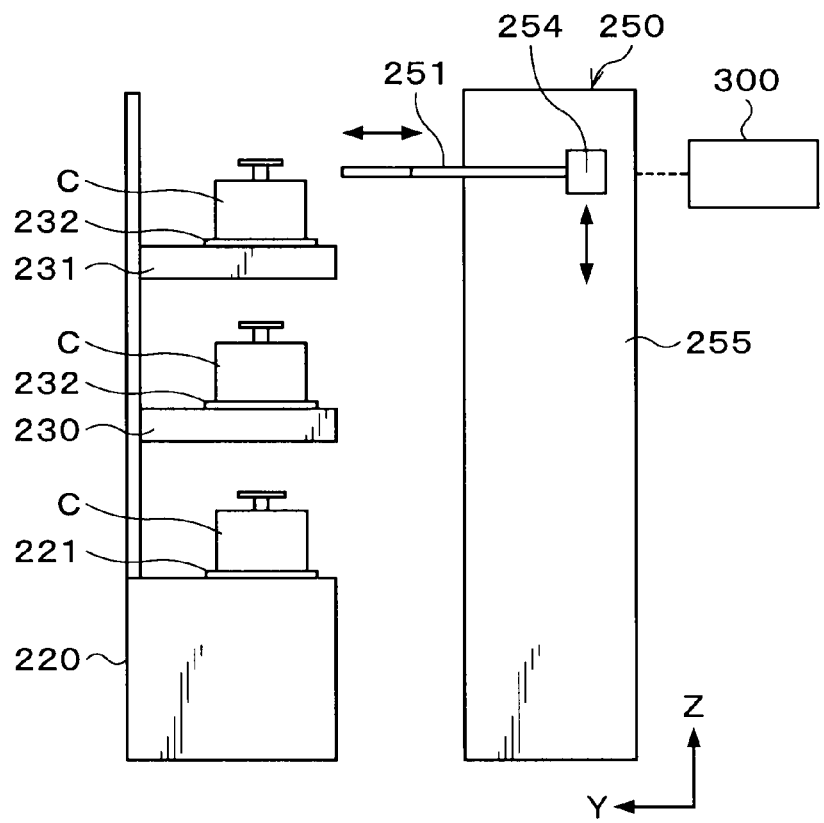
FIG. 20 is a side view schematically showing a structure of the vacant cassette transfer mechanism.
Figure 21:
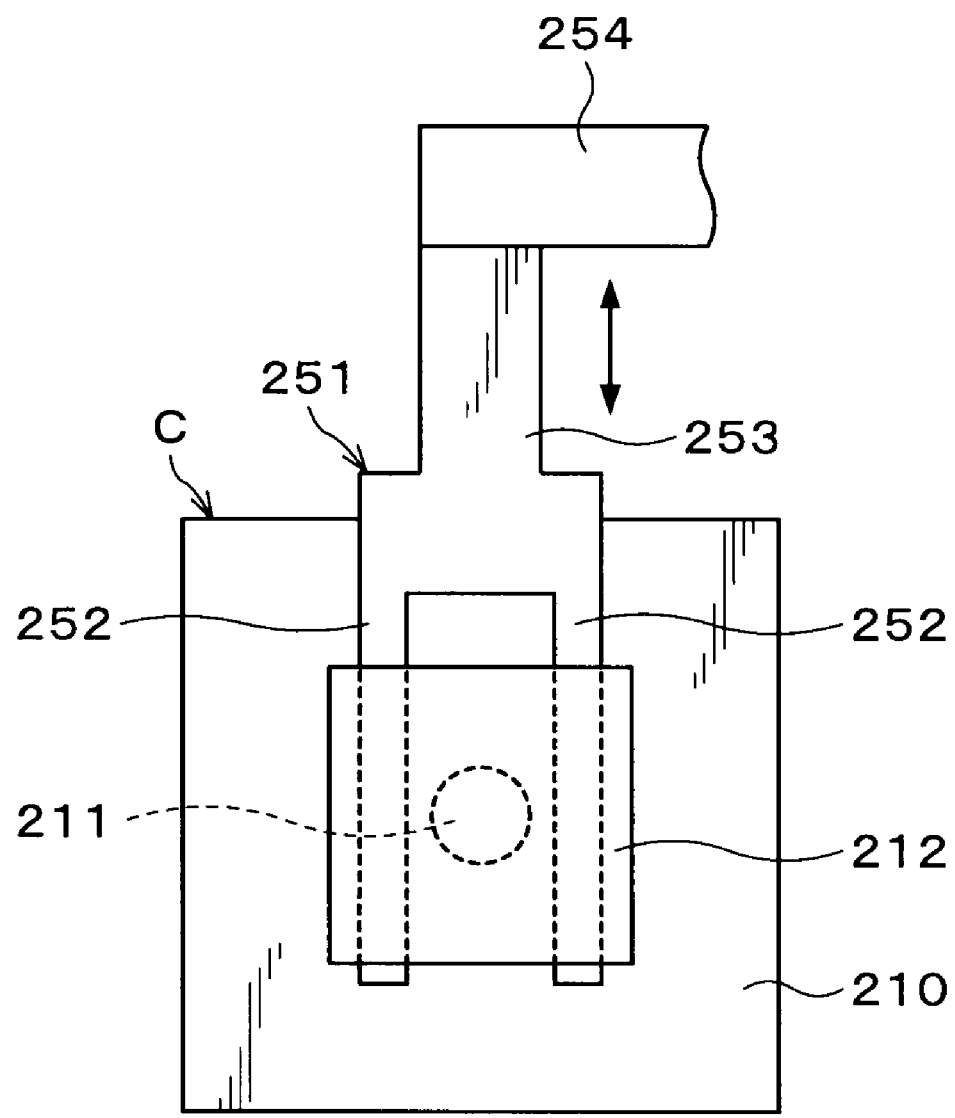
FIG. 21 is a an explanatory view showing a state in which an arm supports the cassette.

As shown in FIGS. 19 and 20, the vacant cassette transfer mechanism 250 includes an arm 251 for supporting the cassette C. As shown in FIG. 21, the arm 251 includes two main body portions 252 and a supporting portion 253 for supporting the main body portions 252. The two main body portions 252 can support the cassette C while being in contact with the lower surface of the locked portion 212 without interfering with the shaft 211 of the cassette C.

As shown in FIGS. 19 and 20, the arm 251 is supported by an arm supporting portion 254 that extends in the horizontal direction (X direction in FIG. 19). The arm supporting portion 254 is supported by an arm driving portion 255 that extends in the vertical direction (Z direction in FIG. 20). In the arm driving portion 255, a motor (not shown) or the like is incorporated, which can move the arm supporting portion 254 and the arm 251 in the horizontal direction (X and Y directions in FIGS. 19 and 20) and in the vertical direction (Z direction in FIG. 20). That is, the arm 251 moves from lateral sides of the vacant cassette loading tables 230 and 231 and the cassette loading table 220 in the horizontal direction (Y direction in the FIGS. 19 and 20) and can transfer the cassettes C to the vacant cassette loading tables 230 and 231 and the cassette loading table 220. In addition, the arm 251 moves in the vertical direction, which can carry the cassettes C among the vacant cassette loading tables 230 and 231 and the cassette loading table 220. It should be noted that in this embodiment, the arm supporting portion 254 and the arm driving portion 255 constitute an arm moving portion.

The operation of the vacant cassette transfer mechanism 250 is controlled by a control portion 300 shown in FIGS. 19 and 20. The control portion 300 controls the operation of the vacant cassette transfer mechanism 250 so that the cassettes C are loaded on appropriate positions of the vacant cassette loading tables 230 and 231 and the cassette loading table 200 at appropriate timings. In this embodiment, for example, to the vacant cassette loading tables 230 and 231 and the loading plates 232 and 221 of the cassette loading table 220, addresses are allocated, and to the cassettes C, cassette IDs are given. The control portion 300 sets positions on which the cassettes C are loaded based on the addresses of the loading plates 232 and 221 and the cassette IDs, and thus controls the operation of the vacant cassette transfer mechanism 250.

Further, in this embodiment, to the wafers W in the cassettes C, wafer IDs corresponding to the cassette IDs are given. The control portion 300 sets the positions on which the cassettes C are loaded so that the wafers W are always contained in the same cassettes C, based on the cassette IDs and the wafer IDs, and thus controls the operation of the vacant cassette transfer mechanism 250.

The control portion 300 controls treatments with respect to the wafers W in the coating/developing treatment system 1, in addition to the operation of the vacant cassette transfer mechanism 250 described above. To the control portion 300, treatment conditions of the wafers W with the wafer IDs thereof are outputted from the respective units of the treatment station 3, the exposing apparatus 4, or the like. Based on the output result, the control portion 300 controls the treatments with respect to the wafers W, and controls the operation of the vacant cassette transfer mechanism 250.

The control portion 300 is constituted by a computer including a CPU, a memory, and the like, and controls the operation of the vacant cassette transfer mechanism 250 and the treatments with respect to the wafers W by executing programs stored in the memory, for example. The various programs are stored in a storage medium such as a computer-readable CD, and are installed to the control portion 300 from the storage medium.

It should be noted that the other structures of the coating/developing apparatus 1 is the same as the structure described in the above embodiment, so a description thereof is omitted.

Next, a description will be given on the operation of the coating/developing apparatus 1 structured as described above.

Figure 22:
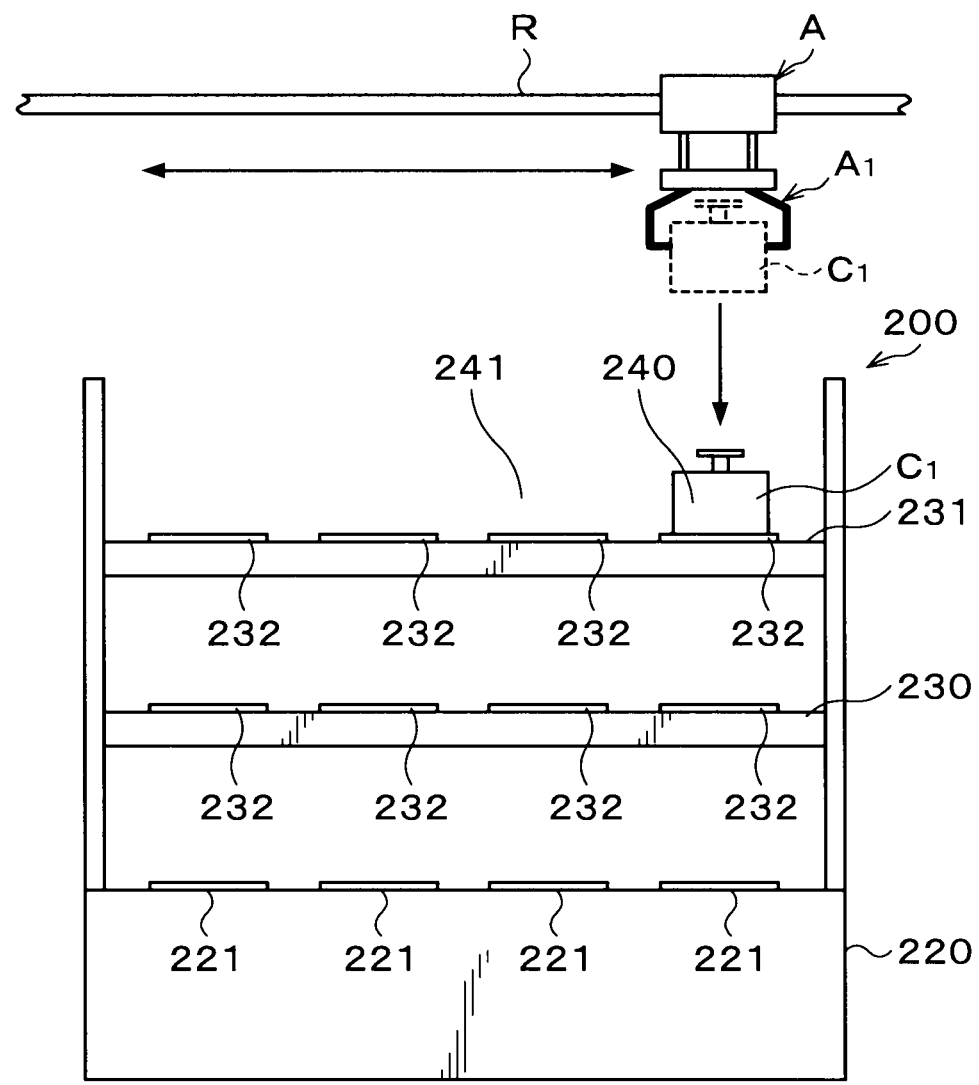
FIG. 22 is an explanatory view showing a state in which the external cassette carrying apparatus loads the cassette into a carry-in space.

First, the cassette C1 containing untreated wafers W of one lot is carried above the carry-in space 240 on the vacant cassette loading table 231 by the external cassette carrying apparatus A. After that, as shown in FIG. 22, the cassette holding portion A1 of the external cassette carrying apparatus A extends downward, and the cassette C1 is loaded onto the loading plate 232 of the carry-in space 240.

Figure 23:
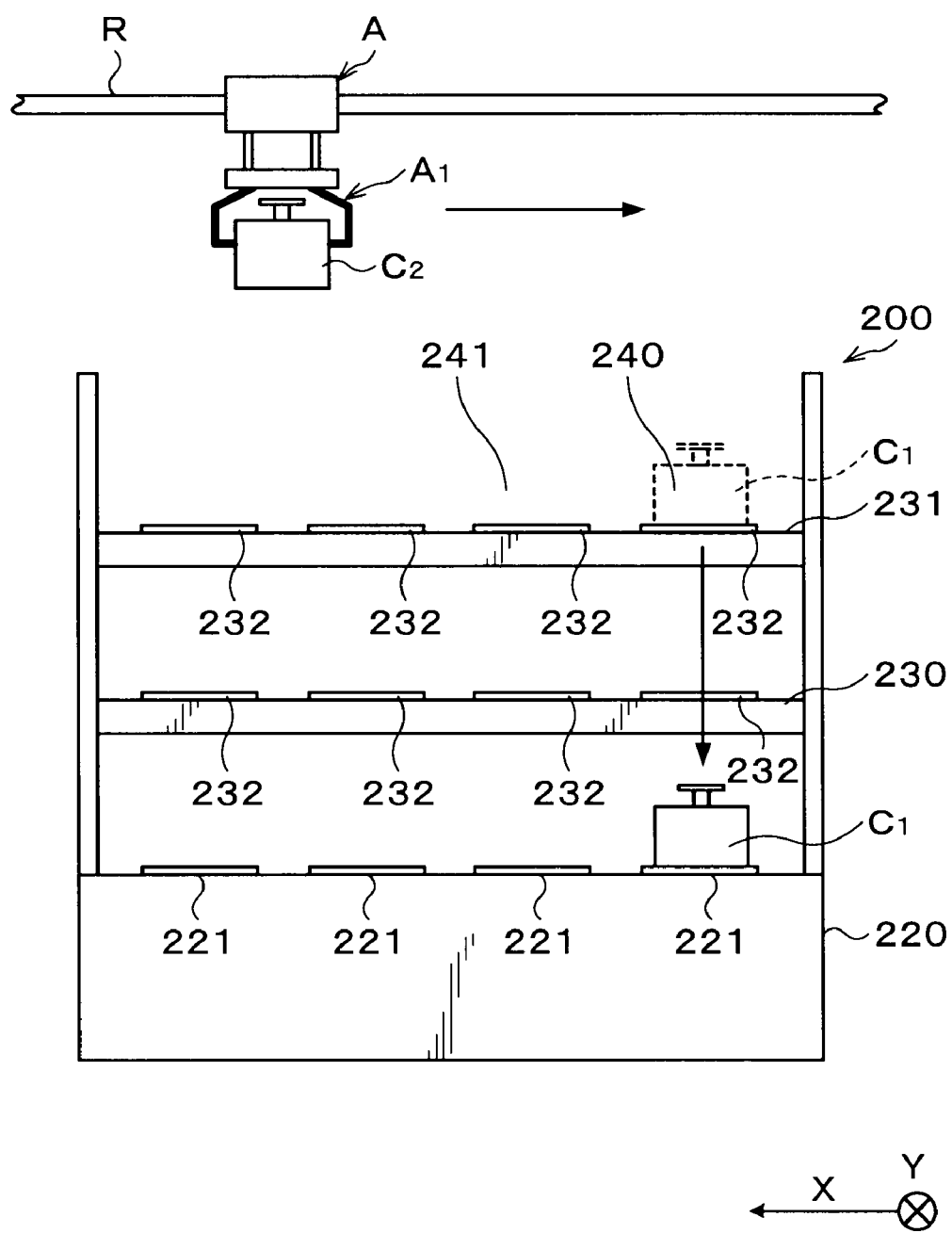
FIG. 23 is an explanatory view showing a state in which the vacant cassette transfer mechanism loads the cassette onto a cassette loading table.

Next, as shown in FIG. 23, the cassette C1 of the carry-in space 240 is loaded onto a predetermined loading plate 221 of the cassette loading table 220 by the vacant cassette transfer mechanism 250. At this time, the cassette C2 of a new lot is carried above the carry-in space 240 by the external cassette carrying apparatus A.

After the cassette C1 is loaded onto the loading plate 221, the loading plate 221 moves to the wafer carrying portion 11 side, and the cassette C1 is set to the wafer carrying opening 11b, as shown in FIG. 15. Then, the door of the cassette C1 is opened by the door opener 50. After that, by the wafer carrying apparatus 61, the wafers W in the cassette C1 are sequentially taken out and carried into the treatment station 3 to be treated.

Figure 24:
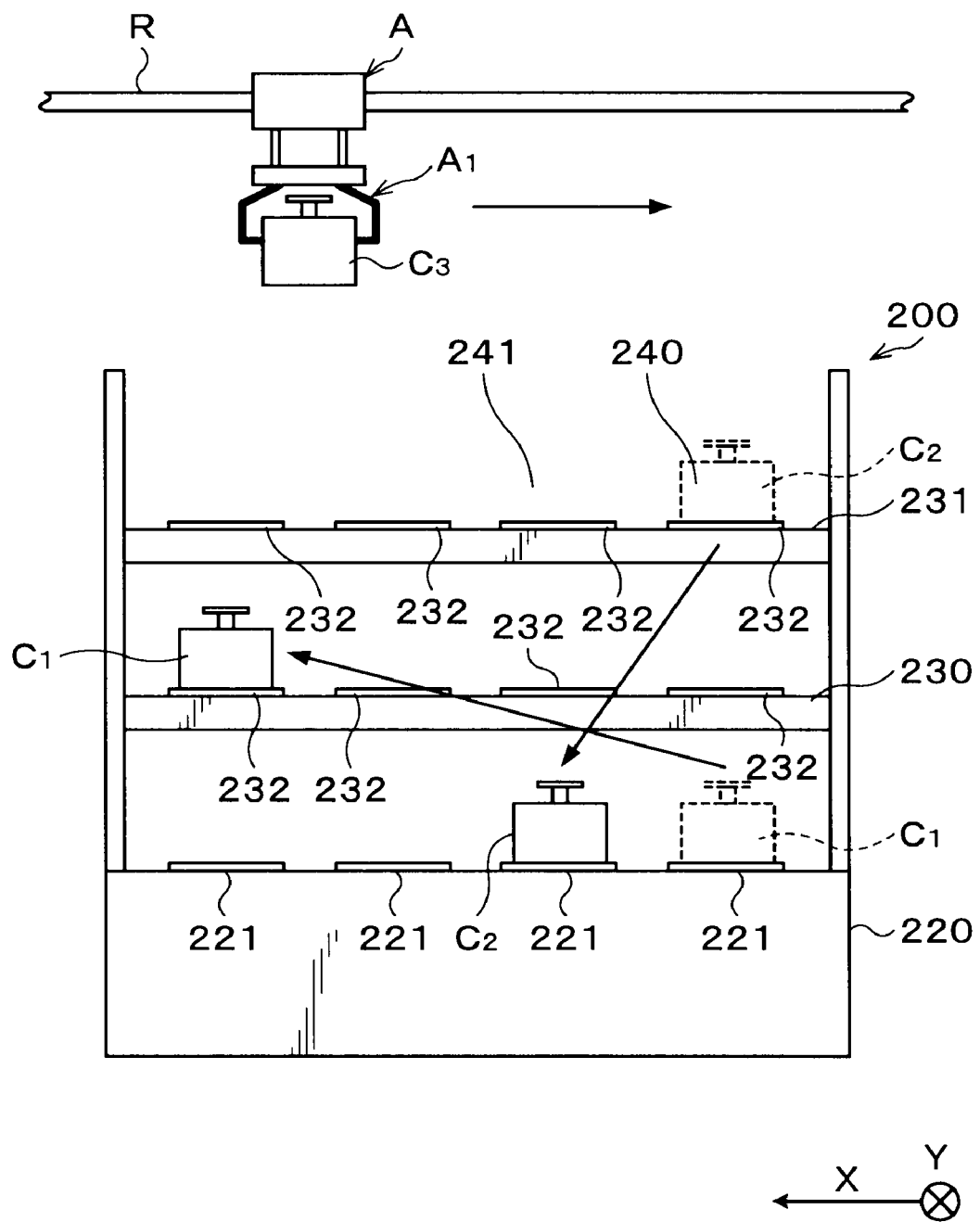
FIG. 24 is an explanatory view showing a state in which the vacant cassette transfer mechanism loads the vacant cassette onto a vacant cassette loading table and loads a next cassette onto a cassette loading table.

While the wafer W in the cassette C1 is carried to the treatment station 3, the cassette C2 in the carry-in space 240 is loaded on another loading plate 221 on the cassette loading table 220 by the vacant cassette transfer mechanism 250, as shown in FIG. 24. At this time, a cassette C3 of a new lot is carried above the carry-in space 240 by the external cassette carrying apparatus A.

After all the wafers W are carried out of the cassette C1, the vacant cassette C1 is transferred to, for example, the vacant cassette loading table 230 by the vacant cassette transfer mechanism 250 as shown in FIG. 24. The vacant cassette C1 is loaded on a predetermined loading plate 232 on the vacant cassette loading table 230, and is temporarily stored on the vacant cassette loading table 230 during the lot treatment with respect to the wafers W. The vacant cassette C1 is loaded on the loading plate 232 until all the wafers W taken out of the cassette C1 are subjected to a predetermined treatment such as a developing treatment at the developing unit 80.

When all the wafers W are carried out of the cassette C1, the loading plate 221 on which the next cassette C2 are loaded is moved to the wafer carrying portion 11 side, and the wafers W in the cassette C2 are sequentially taken out and carried into the treatment station 3 to be treated. After that, when all the wafers W are carried out of the cassette C2, the vacant cassette C2 is loaded on a predetermined loading plate 232 on the vacant cassette loading table 230.

Figure 25:
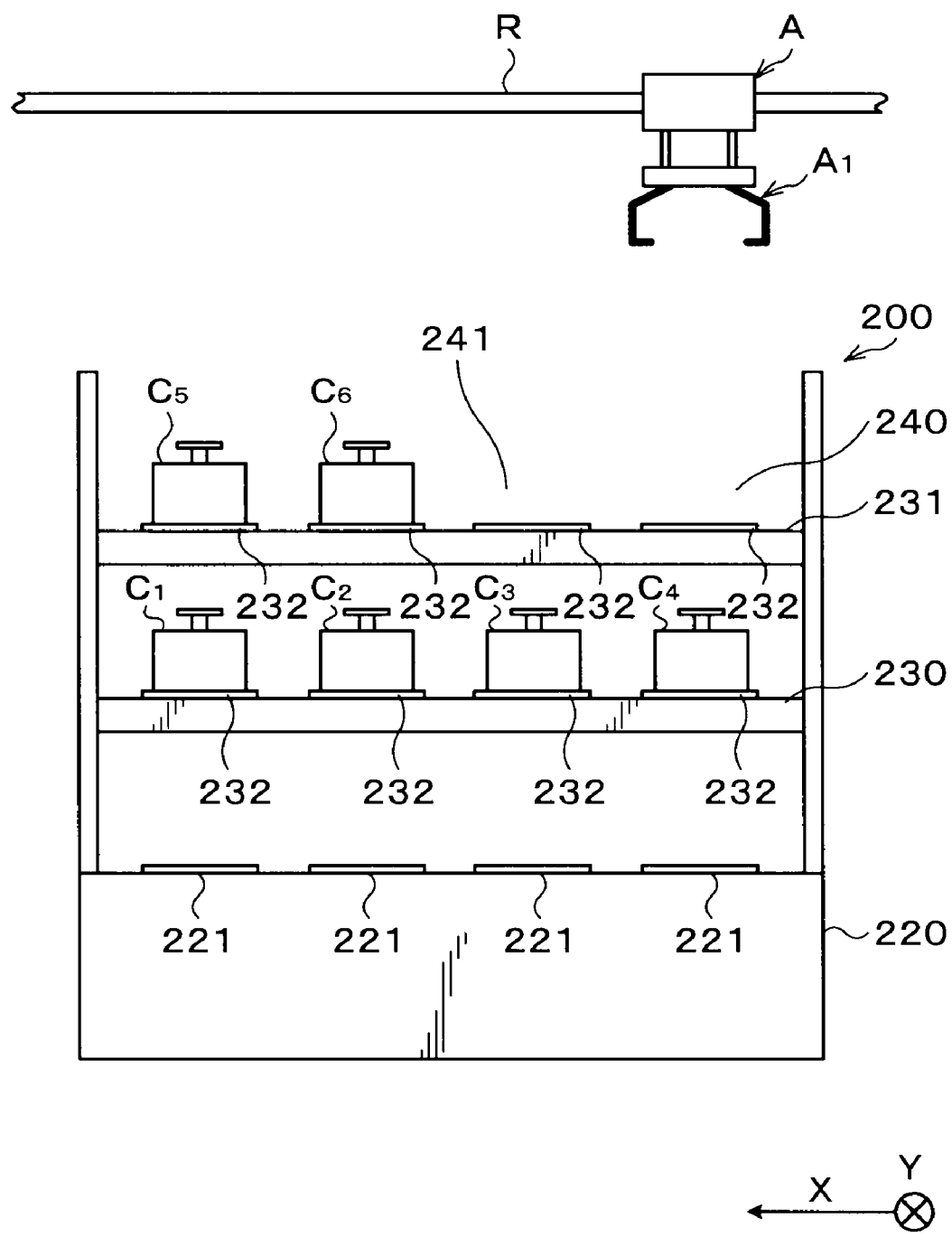
FIG. 25 is an explanatory view showing a state in which a plurality of cassettes are loaded onto vacant cassette loading tables.

In this way, after a predetermined number of, e.g., six, cassettes C1 to C6 are sequentially carried into the cassette station 2, the wafers W in the cassette C1 to C6 are carried into the treatment station 3. Then, the vacant cassette C1 to C6 are loaded on the loading plates 232 on the vacant cassette loading tables 230 and 231, as shown in FIG. 25. It should be noted that the number of the cassettes C that are loaded and stored on the vacant cassette loading tables 230 and 231 is not limited to six, and can be arbitrarily changed according to treatment processes or the like with respect to the wafers W.

Figure 26:
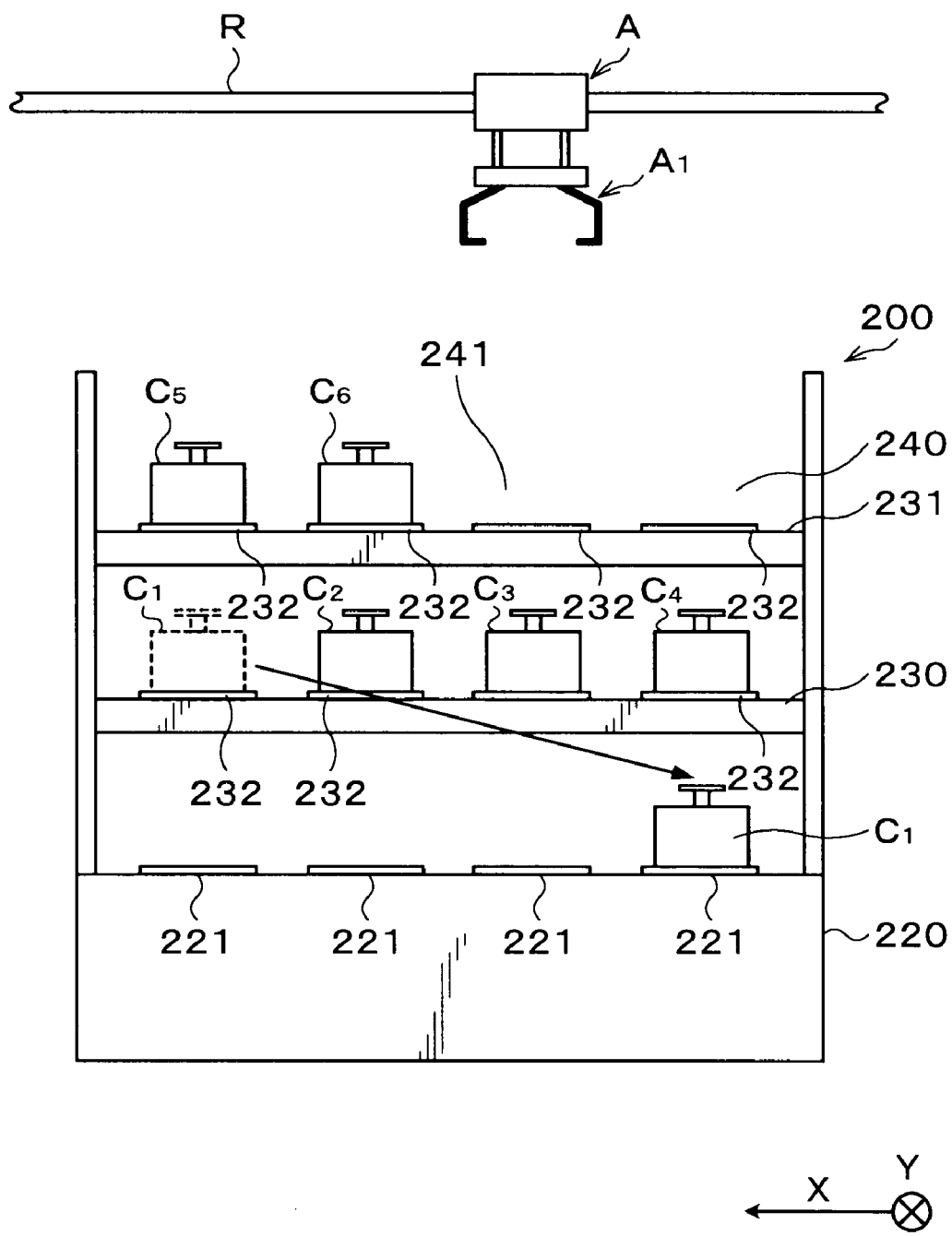
FIG. 26 is an explanatory view showing a state in which the vacant cassette transfer mechanism loads the vacant cassette onto the cassette loading table.

On the other hand, the wafers W carried out of the cassette C1 to the treatment station 3 are subjected to various kinds of treatments. During the treatments, to the control portion 300, the treatment conditions of the wafers W are outputted from the treatment station 3 and the like. In addition, for example, when the developing treatment by the developing unit 80 with respect to all the wafers W of the cassette C1 is ended, the control portion 300 controls the vacant cassette transfer mechanism 250, to thereby transfer the vacant cassette C1 on the vacant cassette loading table 230 onto a predetermined loading plate 221 on the cassette loading table 220, as shown in FIG. 26. After that, the wafers W that have been subjected to a series of photolithography processes are returned to the original cassette C1 by the wafer carrying apparatus 61.

Figure 27:
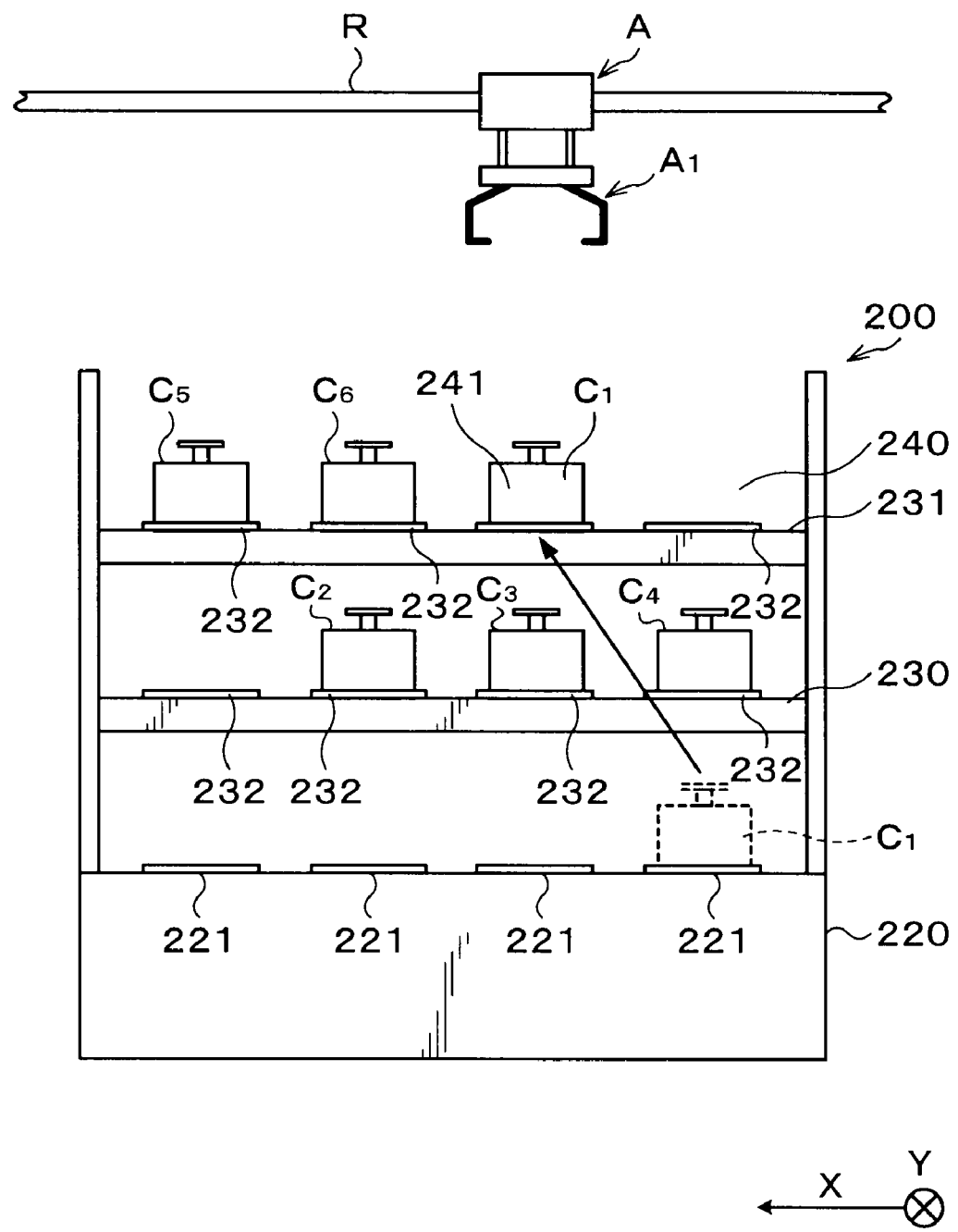
FIG. 27 is an explanatory view showing a state in which the vacant cassette transfer mechanism loads the vacant cassette into a carry-out space.

When all the wafers W are contained into the cassette C1, the cassette C1 is transferred to the carry-out space 241 and is loaded on the loading plate 232 by the vacant cassette transfer mechanism 250, as shown in FIG. 27.

Figure 28:
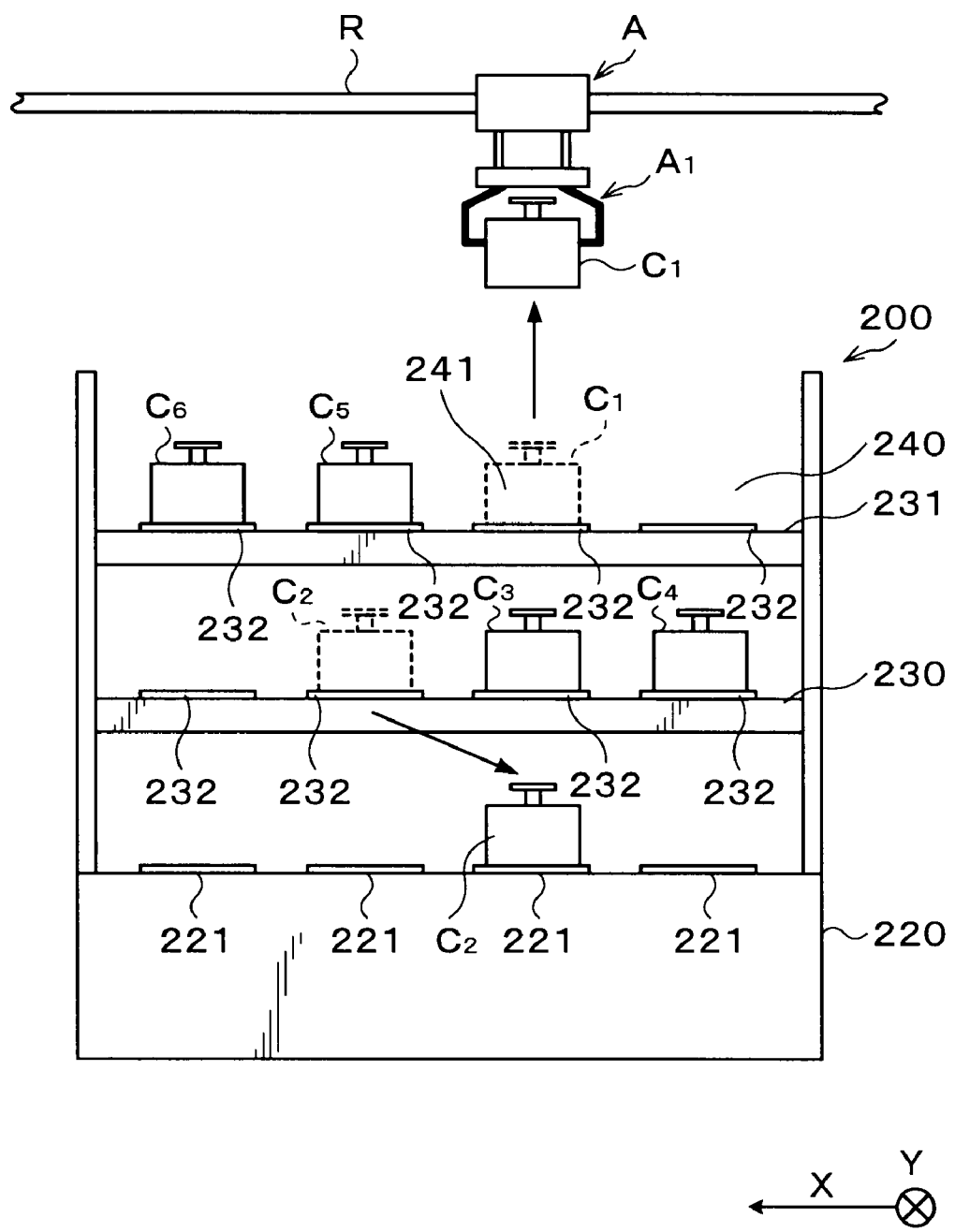
FIG. 28 is an explanatory view showing a state in which the external cassette carrying apparatus carries the cassette out, and the vacant cassette transfer mechanism loads a next vacant cassette onto the cassette loading table.

After that, as shown in FIG. 28, from above the carry-out space 241, the cassette holding portion A1 of the external cassette carrying apparatus A moves downward, and the cassette C1 on the loading plate 232 is held by the cassette holding portion A1. Subsequently, the cassette holding portion A2 moves upward, and the cassette C1 is carried out of the coating/developing apparatus 1. At this time, when the developing treatment by the developing unit 80 with respect to all the wafers W in the cassette C2 is ended, the vacant cassette C2 on the vacant cassette loading table 230 is transferred onto a predetermined loading plate 221 on the cassette loading table 220 by the vacant cassette transfer mechanism 250.

As described above, the cassettes C are sequentially carried into/out of the coating/developing apparatus 1, and the wafers W in the cassettes C are subjected to the photolithography processes.

According to the above embodiments, since the cassette carry-in/out portion 200 of the coating/developing apparatus 1 is provided with the vacant cassette loading tables 230 and 231 and the vacant cassette transfer mechanism 250, the cassettes C caused to be vacant during the lot treatments can be unloaded from the cassette loading table 220 and temporarily stored on the vacant cassette loading tables 230 and 231. Thus, new cassettes C can be sequentially transferred to the cassette loading table 220. Accordingly, even in the treatment with respect to wafers of a small lot in which the number of wafers in one cassette is small, the wafers W can be sequentially carried into the treatment station 3 without time intervals. As a result, it is possible to deal with the small-lot treatment without throughput reduction in the coating/developing apparatus 1. It is also possible to deal with the small-lot treatment without increase in the number of the loading plates 221 on the cassette loading table 220 and without increase in occupied floor area of the coating/developing apparatus 1. Further, the external cassette carrying apparatus A carries the cassettes C into/out of the carry-in space 240 and the carry-out space 241 only, so the cassettes C of the external cassette carrying apparatus A can be carried in the existing way. Consequently, there is no need to change the control and the like for the carrying-in/out of the cassette C by the external cassette carrying apparatus A, for example, which can relatively easily deal with the small-lot treatment.

Further, the provision of the vacant cassette loading tables 230 and 231 and the vacant cassette transfer mechanism 250 as described above is effective for a case where a double patterning used for forming a minute pattern on the wafer W is performed. In the double patterning, a minute pattern formed on a layer on the wafer W is exposed to light twice. After the first exposing process, an etching is performed, and the second exposing process is performed on the same layer again. Therefore, processes performed on the wafer W are different between the first patterning and the second patterning, so time periods required for the respective processes are different. Even when the coating/developing apparatus 1 according to this embodiment is used in the case of the double patterning, by storing the cassettes C on the vacant cassette loading tables 230 and 231, the cassettes C can be transferred onto the cassette loading table 220 at an appropriate timing. Thus, the wafers W that have been subjected to the treatment can be sequentially contained in the cassettes C, with the result that the throughput in the coating/developing apparatus 1 can be increased.

In the above embodiments, the vacant cassette loading tables 230 and 231 are provided directly above the cassette loading table 220. Therefore, the increase in occupied floor area due to the provision of the vacant cassette loading tables 230 and 231 can be prevented.

The arm 251 of the vacant cassette transfer mechanism 250 can be moved in the vertical and horizontal directions by the arm supporting portion 254 and the arm driving portion 255. Accordingly, the arm 251 can be moved from the lateral sides of the vacant cassette loading tables 230 and 231 and the cassette loading table 220 in the horizontal direction, which can transfer the cassettes C onto the vacant cassette loading tables 230 and 231 and the cassette loading table 220. Thus, even when carried into the coating/developing apparatus 1, the plurality of cassettes C can be appropriately transferred to predetermined positions without interfering with each other.

On the vacant cassette loading tables 230 and 231, the carry-in space 240 used for carrying the cassette C to/from the outside of the coating/developing apparatus 1 is provided. The cassette C in the carry-in space 241 is transferred onto the cassette loading table 220 by the vacant cassette transfer mechanism 250. Therefore, new cassettes C can be sequentially carried in the carry-in space 240 by the external cassette carrying apparatus A.

The vacant cassette loading tables 230 and 231 are provided in the plurality of stages, and the plurality of loading plates 232 are provided on each of the cassette loading tables 230 and 231. Therefore, a large number of vacant cassettes C can be stored, and new cassettes C can be transferred to the cassette loading table 220. As a result, it is possible to deal with the smaller-lot treatment without throughput reduction in the coating/developing apparatus 1.

With the use of the coating/developing apparatus 1 according to the above embodiments, the wafers W in the coating/developing apparatus 1 may be controlled to be collected when the coating/developing apparatus 1 is shut down. When the coating/developing apparatus 1 is shut down, it is not necessarily the most efficient to collect the wafers W in the order of carrying into the treatment station 3. For example, the wafer W in the resist coating unit 82 is carried into the treatment station 3 after the wafer W in the exposing apparatus 4, but a carrying path of the former wafer W to the cassette station 2 is shorter than that of the latter wafer W. In this case, it may be more efficient to collect the wafer W in the resist coating unit 82 first. In view of this, when the coating/developing apparatus 1 is shut down, the control portion 300 first determines the order of collecting the wafers W based on the treatment conditions of the wafers. After that, based on the determined collecting order of the wafers W, the control portion 300 controls the vacant cassette transfer mechanism 250, and thus the vacant cassettes C on the vacant cassette loading tables 230 and 231 are transferred onto the cassette loading table 220. As a result, the wafers W that remain in the coating/ developing apparatus 1 at the time of shutting down can be efficiently collected, which can improve the throughput.

In the above embodiments, the wafers W in the cassettes C are carried to the treatment station 3 to be treated in the order of carrying to the cassette loading table 220, but the order may be changed according to the treatment conditions of the wafers W in the cassettes C. For example, a case where heat treatments are sequentially performed on the wafers W at different heat-treatment temperatures in the heat treatment unit 90 is considered. Specifically, in a case where the heat-treatment temperatures with respect to the wafers W in the cassette C1, the cassette C2, and the cassette C3 are 90° C., 100° C., and 90° C., respectively, even when the cassettes C1 to C3 are transferred onto the cassette loading table 220 in the stated order, the wafers W in the cassettes C1 and C3 are carried to the treatment station 3, and thereafter the wafers W in the cassette C2 are carried to the treatment station 3. As a result, in the heat treatment unit 90, the wafers W can be subjected to the sequential heat treatments by changing the heat-treatment temperature once. Thus, the throughput in the coating/developing apparatus 1 can be improved. It should be noted that the treatment condition is not limited to the heat-treatment temperatures, and another treatment condition may be applied.

In the above embodiments, the cassette loading table 220 is provided in one stage, but may be provided in two or more stages. Further, the vacant cassette loading tables 230 and 231 are provided in two stages in a layered manner, but may be provided in three or more stages. In addition, the vacant cassette loading tables 230 and 231 are provided on the positive Y direction side of the vacant cassette transfer mechanism 250 as shown in FIG. 15, but another vacant cassette loading table may be further provided on the negative Y direction side of the vacant cassette transfer mechanism 250. Furthermore, the number of the loading plates 232 of the vacant cassette loading tables 230 and 231 can be arbitrarily increased. In this way, the number of the loading positions of the cassettes C is increased, which can store a larger number of vacant cassettes C, and can transfer new cassettes C onto the cassette loading table 220. As a result, it is possible to deal with the smaller-lot treatment without throughput reduction in the coating/developing apparatus 1.

In the above embodiments, the vacant cassette loading tables 230 and 231 are fixed above the cassette loading table 220 in position, but may be detachably attached. With this structure, for example, the vacant cassette loading tables 230 and 231 can be easily maintained. In addition, even when the vacant cassette loading tables 230 and 231 are detached, the coating/developing apparatus 1 can be operated without any change.

In the above, the descriptions are given on the preferred embodiments of the present invention with reference to the attached drawings, but the present invention is not limited to those embodiments. It is obvious that a person skilled in the art can conceive various kinds of changed examples or modified examples within the scope of the idea described in the claims, and it is understood that those examples are of course within the technical scope of the present invention.

The substrate treatment apparatus according to the above embodiments is the coating/developing apparatus for performing the photolithography process, but may be a treatment apparatus for performing another process. Further, the present invention can be applied to another substrate treatment apparatus such as an FPD (flat panel display) and a mask reticle for a photo mask, in addition to the semiconductor wafer.

The present invention is useful for the substrate treatment apparatus for performing the small-lot treatment.

What is claimed is:

1. A substrate treatment apparatus, comprising:
a cassette loading portion on which a cassette for containing a substrate is loaded when the cassette is carried to/from outside of the substrate treatment apparatus;
a substrate treatment portion that performs a treatment on the substrate;
a substrate carrying portion that carries the substrate in the cassette loaded on the cassette loading portion to the substrate treatment portion, and that carries the substrate that has been subjected to the treatment by the substrate treatment portion to the cassette on the cassette loading portion;
a vacant cassette loading portion disposed above the cassette loading portion and on which the cassette caused to be vacant by carrying the substrate to the substrate treatment portion is temporarily loaded;
a vacant cassette transfer mechanism for transferring the vacant cassette between the vacant cassette loading portion and the cassette loading portion; and
a cassette carrying apparatus that vertically moves from the outside of the substrate treatment apparatus to carry the cassette into/out of the cassette loading portion and that is provided outside the substrate treatment apparatus,
wherein said vacant cassette loading portion includes two supporting members parallel to each other that support a lower surface of the cassette, and
wherein said vacant cassette loading portion forms a path through which the cassette carrying apparatus and the cassette carried by the cassette carrying apparatus are vertically moved by distancing the two supporting members from each other.

2. The substrate treatment apparatus according to claim 1, wherein:
the vacant cassette transfer mechanism includes:
an arm that supports the cassette, and
an arm moving portion that vertically and horizontally moves the arm, and;
the arm horizontally moves from lateral sides of the vacant cassette loading portion and the cassette loading portion to carry the cassette to the vacant cassette loading portion and the cassette loading portion.

3. The substrate treatment apparatus according to claim 2, wherein
the cassette includes:
a main body portion that contains the substrate, and
a locked portion that protrudes upward from an upper surface of the main body portion and is locked by the arm of the vacant cassette transfer mechanism.

4. The substrate treatment apparatus according to claim 1, wherein:
the supporting members is evacuated to outside of a path through which the cassette carrying apparatus and the cassette carried by the cassette carrying apparatus are vertically moved.

5. The substrate treatment apparatus according to claim 1, wherein the vacant cassette loading portion allows a plurality of cassettes to be horizontally loaded thereon, and horizontally moves the cassette loaded so that the cassette loaded is prevented from hindering the path through which the cassette carrying apparatus and the cassette carried by the cassette carrying apparatus are moved.

6. The substrate treatment apparatus according to claim 5, wherein:
- the cassette loading portion allows a plurality of cassettes to be loaded and horizontally arranged thereon;
- the vacant cassette loading portion allows the plurality of cassettes to be loaded and horizontally arranged thereon;
- the vacant cassette loading portion includes a plurality of cassette moving apparatuses that horizontally move the cassette with the cassette being loaded on the plurality of cassette moving apparatuses; and
- the plurality of cassette moving apparatuses are horizontally arranged and carry the cassette between adjacent cassette moving apparatuses of the plurality of cassette moving apparatuses.

7. The substrate treatment apparatus according to claim 1, wherein the vacant cassette loading portion includes a plurality of vacant cassette loading portions that are vertically arranged.

8. The substrate treatment apparatus according to claim 1, wherein the vacant cassette transfer mechanism is disposed above the vacant cassette loading portion, and is moved through the path through which the cassette carrying apparatus and the cassette carried by the cassette carrying apparatus are moved, to transfer the vacant cassette to the vacant cassette loading portion and the cassette loading portion.

9. The substrate treatment apparatus according to claim 8, wherein the vacant cassette transfer mechanism is movable horizontally.

* * * * *